United States Patent [19]

Ueda

[11] Patent Number: 5,612,695
[45] Date of Patent: Mar. 18, 1997

[54] MULTIPLEXER CIRCUIT AND DEMULTIPLEXER CIRCUIT

[75] Inventor: Kimio Ueda, Hyogo, Japan

[73] Assignee: Mitsubishi Denki Kabushiki Kaisha, Tokyo, Japan

[21] Appl. No.: 395,001

[22] Filed: Feb. 27, 1995

[30] Foreign Application Priority Data

Mar. 31, 1994 [JP] Japan ................... 6-064129

[51] Int. Cl.⁶ ........................................... H03M 9/00
[52] U.S. Cl. ................... 341/101; 341/100; 370/535; 370/516
[58] Field of Search ............................ 341/101, 100; 370/105.3

[56] References Cited

U.S. PATENT DOCUMENTS

| 3,961,138 | 6/1976 | Fellinger ................. | 178/69.5 |
| 4,727,541 | 2/1988 | Mori et al. ............... | 370/112 |

OTHER PUBLICATIONS

"Multi-Gbits/s Silicon Bipolar Multiplexer And Demultiplexer With Interleaved Architectures", Kevin Negus, Bipolar Circuits and Technology Meeting IEEE 1991, pp. 35–38.

*Primary Examiner*—Jeffrey A. Gaffin
*Assistant Examiner*—Peguy JeanPierre
*Attorney, Agent, or Firm*—Lowe, Price, LeBlanc & Becker

[57] ABSTRACT

A counter circuit provides select signals SEL0–SEL3 of a cycle 4Tc sequentially attaining a high level for every ¼ cycle Tc. A 4-input selector circuit receives data signals I0–I3 of a cycle 4Tc to sequentially output the same for every ¼ period of Tc in response to a high level of select signals SEL0–SEL3. A flipflop circuit fetches and outputs an output of the selector circuit in synchronization with a clock signal C0. The number of hardware components is reduced in comparison with the conventional case where a select signal generation circuit generates only one select signal SEL, and where a plurality of flipflop circuits and 2-input selector circuits carry out a select and shifting operation of parallel data signals I0–I3.

13 Claims, 23 Drawing Sheets

MULTIPLEXER CIRCUIT AND DEMULTIPLEXER CIRCUIT

BACKGROUND OF THE INVENTION

1. Field of the Invention

The present invention relates to multiplexer circuits and demultiplexer circuits. More particularly, the present invention relates to a multiplexer circuit for converting M parallel data signals of a bit into a serial data signal of M bits in synchronization with a clock signal, and a demultiplexer circuit for converting a serial data signal of M bits into M parallel data signals of a bit in synchronization with a clock signal.

2. Description of the Prior Art

FIG. 14 is a block diagram showing a structure of a conventional shift register type 4:1 multiplexer circuit 100 described in pp. 35–38 in "Bipolar Circuits and Technology Meeting", IEEE 1991. FIG. 15 is a timing chart showing the operation thereof. Referring to FIG. 14, multiplexer circuit 100 includes a clock signal input terminal C', data signal input terminals D0'–D3' and a data signal output terminal Q'. A clock signal C0 is applied to clock signal input terminal C'. As shown in FIG. 15(c), clock signal C0 attains a low level or a high level for every half cycle Tc/2. 4 parallel data signals I0–I3 of 4 bits are applied to data signal input terminals D0'–D3', respectively. As shown in (a) and (b) in FIG. 15, data signals I0–I3 attain a high level or a low level at 4 times the cycle of clock signal C0 in synchronization with a fall of clock signal C0.

Multiplexer circuit 100 includes flipflop circuits 102–104, 106–109, selector circuits 110–112, and a 3-input NOR gate 105.

Each element will be described hereinafter with reference to the circuit diagram of FIG. 16 and the timing chart of FIG. 17. Referring to FIG. 16, flipflop circuit 102 includes a clock signal input terminal C, a data signal input terminal D, data signal output terminals Q, QB, first and second reference potential terminals VB1, VB2, and first and second power supply terminals Vcc, Vee.

A clock signal C0 is applied to clock signal input terminal C. As show in FIG. 17(b), clock signal C0 attains a high level or a low level for every half cycle Tc/2. A data signal I is applied to data signal input terminal D. As shown in FIG. 17(a), data signal I attains a high level or a low level at the same synchronization of clock signal C2 in synchronization with a fall of clock signal C0.

A threshold potential of a logic amplitude of data signal I input to data signal input terminal D is applied to first reference potential terminal VB1. A threshold potential of a logic amplitude of clock signal C0 input to clock signal input terminal C is applied to second reference potential terminal VB2. A first power supply potential is applied to first power supply terminal Vcc. A second power supply potential lower than the first power supply potential is applied to second power supply terminal Vee.

Flipflop circuit 102 includes a master circuit and a slave circuit. The master circuit includes resistors R4, R5, bipolar transistors Q31–Q38, and constant current sources CS1214 CS14. Transistors Q31 and Q32 have their bases connected data signal input terminal D and first reference potential terminal VB1, and their collectors connected to first power supply terminal Vcc via resistors R4 and R5, respectively, and the commonly-connected emitters connected to the collector of transistor Q33. Transistors Q34 and Q35 have their bases connected to the collectors of transistors Q32 and Q31, respectively, their collectors connected to the collectors of transistors Q31 and Q32, respectively, and their commonly-connected emitters connected to the collector of transistor Q36. Transistors Q33 and Q36 have their bases connected to clock signal input terminal C and second reference potential terminal VB2, respectively, and their commonly-connected emitters connected to second power supply terminal Vee via constant current source CS12. Transistors Q37 and Q38 have their bases connected to the collectors of transistors Q32 and Q31, respectively, the collectors both connected to first power supply terminal Vcc, and their emitters connected to second power supply terminal Vee via constant current sources CS13 and CS14, respectively.

The slave circuit includes resistors R6, R7, bipolar transistors Q39–Q46, and constant current sources CS15–CS17. Transistors Q39 and Q40 have their bases connected to the emitters of transistors Q37 and Q38, respectively, the collectors connected to first power supply terminal Vcc via resistors R6 and R7, respectively, and the commonly-connected emitters connected to the collector of transistor Q41. Transistors Q42 and Q43 have their bases connected to the collectors of transistors Q40 and Q39, respectively, the collectors connected to the collectors of transistors Q40 and Q39, respectively, and the commonly-connected emitters connected to the collector of transistor Q44. Transistors Q41 and Q44 have their bases connected to second reference potential terminal VB2 and clock signal input terminal C, respectively, and the commonly-connected emitters connected to second power supply terminal Vee via constant current source CS15. Transistors Q45 and Q46 have their bases connected to the collectors of transistors Q40 and Q39, respectively, their collectors both connected to first power supply potential Vcc, and their emitters connected to data signal output terminals Q and QB, respectively, as well as to second power supply terminal Vee via constant current sources CS16 and CS17.

Bipolar transistors Q31 and Q32 and bipolar transistors Q39 and Q40 each form a data writing circuit, and bipolar transistors Q34 and Q35 and bipolar transistors Q42 and Q43 each form a data holding circuit.

The operation of flipflop circuit 102 of FIG. 16 will be described hereinafter. When clock signal C0 applied to data signal input terminal C attains a high level, bipolar transistors Q33 and Q44 are turned on, and the data writing circuit of the master circuit and the data holding circuit of the slave circuit are turned on. Transistors Q36 and Q41 are turned off, and the data holding circuit of the master circuit and the data writing circuit of the slave circuit are turned off. If the data signal (assumed to be ID1) applied to transistor Q31 attains a high level, transistor Q31 is turned on and transistor Q32 is turned off, whereby the current set by constant current source CS12 flows to resistor R4 via transistors Q31 and Q33. The voltage drop of resistor R4 causes reduction in the base potential of transistor Q38, whereby transistor Q38 is turned off to output a signal of a low level. Current does not flow to resistor R5 since transistor Q32 is turned off. Therefore, transistor Q37 is turned on to output a signal of a high level. Thus, data writing is effected in the master circuit. In the slave circuit, the data holding circuit is turned on, so that the previous data signal (assumed to be ID0) is held. This previous data is output via transistors Q45 and Q46. Transistors Q45 and Q46 provide complementary signals, as in the case of transistors Q37 and Q38.

When clock signal C0 applied to clock signal input terminal C is brought to a low level from a high level (time t2 in FIG. 17), bipolar transistors Q36 and Q41 are turned off, whereby the data holding circuit of the master circuit and the data writing circuit of the slave circuit are turned on. Transistors Q33 and Q44 are turned off, and the data writing circuit of the master circuit and the data holding circuit of the slave circuit are turned off. Bipolar transistors Q34 and Q35 have their base terminals and collector terminals cross-coupled. Therefore, transistor Q34 is turned on and transistor Q35 is turned off by data signal ID1 applied during a high level of clock signal C0. As a result, data signal ID1 is maintained. Transistors Q37 and Q38 continue to provide the same value to the slave circuit when clock signal C0 attains a high level.

The data writing circuit of the slave circuit is turned on, and transistors Q37 and Q38 provide signals of a high level and a low level, respectively. Therefore, transistor Q39 is turned on and transistor Q40 is turned off. As a result, the current set by constant current source CS15 flows through resistor R6 via transistors Q39 and Q41. This causes transistor Q46 to provide a signal of a low level. Because transistor Q40 is off, no current flows in resistor R7, and transistor Q45 provides a signal of a high level. Thus, data is updated in the slave circuit. A similar operation is carried out when the input data of data signal input terminal D attains a low level. In this case, transistor Q46 provides a signal of a high level, and transistor Q45 provides a signal of a low level.

According to the above-described flipflop circuit 102, data in the master circuit is applied when clock signal C0 attains a high level, and data in the slave circuit is updated when clock signal C0 attains a low level.

In flipflop circuit 102, bipolar transistors Q31 and Q32 having the emitter terminals connected to each other and bipolar transistors Q33 and Q36 having the emitter terminals connected to each other are connected in series between power supply terminals Vcc and Vee. A circuit having such a circuit configuration is called a two-stage series gate type circuit.

FIG. 18 is a circuit diagram showing a structure of a 2-input selector circuit 110. Referring to FIG. 18, 2-input selector circuit 110 includes a select signal input terminal S, first and second data signal input terminals D1, D2, a data signal output terminal Q, first and second reference potential terminals VB1, VB2, and first and second power supply terminals Vcc and Vee. A threshold potential of a logic amplitude of the signal entered to first and second data signal input terminals D1 and D2 is applied to first reference potential terminal VB1. A threshold potential of a logic amplitude of the signal entered to bipolar transistor Q50 is applied to second reference potential terminal VB2.

2-input selector circuit 110 includes a resistor R8, bipolar transistors Q47–Q54, and constant current sources CS18–CS20. Transistor Q47 has its base connected to select signal input terminal S, its collector connected to first power supply terminal Vcc, and its emitter connected to second power supply terminal Vee via constant current source CS18. Transistors Q48 and Q52 have their bases connected to first and second data signal input terminals D1 and D2, respectively, their collectors both connected to first power supply terminal Vcc, and their emitters connected to the collectors of transistors Q50 and Q53, respectively. Transistors Q42 and Q51 have their bases both connected to first reference potential terminal VB1, and their collectors both connected to first power supply terminal Vcc via resistors R8, and their emitters connected to the collectors of transistors Q50 and Q53, respectively. Transistors Q50 and Q53 have their bases connected to the emitter of transistor Q47 and second reference potential terminal VB2, respectively, and their commonly-connected emitters connected to second power supply terminal Vee via constant current source CS19. Transistors Q54 has its base connected to the collector of transistor Q49, its collector connected to first power supply terminal Vcc, and its emitter connected to data signal output terminal Q as well as to second power supply terminal Vee via constant current source CS20.

The operation of 2-input selector circuit 110 of FIG. 18 will be described. When the signal applied to select signal input terminal S attains a high level, bipolar transistor Q50 is turned on and bipolar transistor Q53 is turned off. When a signal of a high level is applied to data signal input terminal D1 under this state, transistor Q48 is turned on and transistor Q49 is turned off. As a result, the current of constant current source CS19 flows via transistors Q48 and Q50. Therefore, no current flows in resistor R8, and transistor Q54 provides a signal of a high level.

When the signal applied to select signal input terminal S attains a low level, transistor Q50 is turned off and transistor Q53 is turned on. If a signal of a high level is applied to data signal input terminal D2 under this state, transistor Q52 is turned on and transistor Q51 is turned off. As a result, the current of constant current source CS19 flows via transistors Q52 and Q53. Therefore, no current flows in resistor R8, and transistor Q54 provides a signal of a high level.

A similar operation is carried out when the signal applied to data input terminals D1 and D2 attains a low level. The data signal applied to data input terminal D1 and the data signal applied to data input terminal D2 are output via transistor Q54 when the select signal attains a high level and a low level, respectively.

In the above-described 2-input selector circuit 110, the signal applied to data signal input terminal D1 is output when the select signal attains a high level, and the signal applied to data signal input terminal D2 is output when the select signal attains a low level.

FIG. 19 is a circuit diagram showing a structure of a 3-input NOR gate 105. Referring to FIG. 19, 3-input NOR gate 105 includes data signal input terminals D0–D2, a data signal output terminal Q, a first reference potential terminal VB1, and first and second power supply terminals Vcc, Vee. A threshold potential of a logic amplitude of the signals applied to data terminals D0–D2 is provided to first reference potential terminal VB1.

3-input NOR gate 105 further includes bipolar transistors Q55–Q59, a resistor R9, and constant current sources CS21 and CS22. Transistors Q55–Q57 have their bases connected to data signal input terminals D2, D1, and D0, respectively, their commonly-connected collectors connected to first power supply terminal Vcc via resistor R9, and their commonly-connected emitters connected to second power supply terminal Vee via constant current source CS21. Transistor Q58 has its base connected to first reference potential terminal VB1, its collector connected to first power supply terminal Vcc, and its emitter connected to the emitters of transistors Q55–Q57. Transistor Q59 has its base connected to the collectors of transistors Q55–Q57, its collector connected to first power supply terminal Vcc, and its emitter connected to data signal output terminal Q as well as to second power supply terminal Vee via constant current source CS22.

The operation of 3-input NOR gate 105 of FIG. 19 will be described hereinafter. In this circuit, bipolar transistor Q58 is turned off when any of the signals applied to data signal input terminals D0–D2 attains a high level. Therefore, the current from constant current source CS21 flows to resistor R9 via any of transistors Q55–Q57 turned on, whereby data signal output terminal Q provides a signal of a low level.

Bipolar transistor Q58 is turned on when all the signals applied to data signal input terminals D0–D2 attain a low level. The current from constant current source CS21 flows through transistor Q58, and current will not flow in resistor R9. Therefore, data signal output terminal Q provides a signal of a high level. Thus, this gate forms a 3-input NOR logic.

In FIG. 14, a 4-bit counter circuit 101 is formed of flipflop circuits 102–104, and a 3-input NOR gate 105. In 4-bit counter circuit 101, each output Q of flipflop circuits 102 and 103 is sequentially applied to input D of a succeeding stage of flipflop circuits 103 and 104, so that data is shifted for every cycle of clock signal C0. Since 3-input NOR gate 105 receives output Q of each of three flipflop circuits 102–104, a signal of a high level is output for only 1 cycle for every 4 cycles of clock signal C0. By taking an inverted output QB of flipflop circuit 102 in the 4-bit counter, a select signal SEL is obtained that provides a low level for only 1 cycle for every 4 cycles of clock signal C0, as shown in FIG. 15(d). This signal is applied to select signal input terminal S of 2-input selector circuits 110–112.

Externally applied data signals I0–I2 are provided to each data signal input terminal D1 of selector circuits 112, 111, and 110. Externally applied data I3 is provided to data signal input terminal D of flipflop circuit 106. Each output Q of flipflop circuits 106–108 is connected to each data signal input terminal D2 of selector circuits 110–112. Selector circuits 110–112 output data of input terminal D2 and input terminal D1 when select signal SEL attains a low level and a high level, respectively. Thus, externally applied parallel data signals I0–I3 are captured by the flipflop circuit when select signal SEL attains a low level, and shifted and held by the flipflop circuit when the select signal SEL attains a high level. The parallel data signals are output from flipflop circuit 109 as a serial data signal Z as shown in FIG. 15(e).

FIG. 20 is a block diagram showing a structure of a conventional interleave type 1:4 demultiplexer circuit 110 described in pp. 35–38 in "Bipolar Circuits and Technology Meeting", IEEE 1991. FIG. 21 is a timing chart showing the operation thereof. Referring to FIG. 20, a demultiplexer circuit 110 includes a clock signal input terminal C', a data signal input terminal D', and data signal output terminals Q0'–Q3'. A clock signal CO is applied to clock signal input terminal C'. Clock signal C0 attains a high level or a low level for every half cycle Tc/2 as shown in FIG. 21(b). A serial data signal I is applied to data signal input terminal D'. Data signal I attains a high level or a low level at the same cycle of clock signal C0 in synchronization with a rise of clock signal C0, as shown in FIG. 21(a).

Demultiplexer circuit 110 includes flipflop circuits 112, 115–126, and latch circuits 113, 114.

Latch circuit 113 will first be described with reference to the structure of FIG. 22 and the timing chart of FIG. 23. Referring to FIG. 22, latch circuit 113 includes a clock signal input terminal C, a data signal input terminal D, data signal output terminals Q, QB, first and second reference potential terminals VB1, VB2, and first and second power supply terminals Vcc and Vee.

A clock signal C0 is applied to clock signal input terminal C. As shown in FIG. 23(c), clock signal C0 attains a low level and a high level for every half cycle Tc/2. Data signal I is applied to data signal input terminal D. As shown in FIG. 23(a), data signal I attains a high level and a low level at the same cycle of clock signal C0 in synchronization with a fall of clock signal C0.

A threshold potential having a logic amplitude of data signal I is applied to first reference potential terminal VB1. A threshold potential having a logic amplitude of clock signal C0 is applied to second reference potential terminal VB2.

Latch circuit 113 includes bipolar transistors Q60–Q67, resistors R10, R11, and constant current sources CS23–CS25. Transistors Q60 and Q61 have their bases connected to data signal input terminal D and first reference potential terminal VB1, their collectors connected to first power supply terminal Vcc via resistors R10 and R11, respectively, and their commonly-connected emitters connected to the collector of transistor Q62. Transistors Q63 and Q64 have their bases connected to the collectors of transistors Q61 and Q60, respectively, their collectors connected to the collectors of transistors Q60 and Q61, respectively, and their commonly-connected emitters connected to the collector of transistor Q65. Transistors Q62 and Q65 have their bases connected to second reference potential terminal VB2 and clock signal input terminal C, respectively, and their commonly-connected emitters connected to second power supply terminal Vee via constant current source CS23. Transistors Q66 and Q67 have their bases connected to the collectors of transistors Q61 and Q60, respectively, and their collectors both connected to first power supply terminal Vcc, and their emitters connected to data signal output terminals Q and QB, respectively, as well as to second power supply terminal Vee via constant current sources CS20 and CS25, respectively.

Latch circuit 13 has a circuit structure identical to that of the master circuit portion of flipflop circuit 102 of FIG. 16. Bipolar transistors Q60 and Q61 form a data writing circuit and bipolar transistors Q63 and Q64 form a data holding circuit.

The operation of latch circuit 113 of FIG. 22 will be described hereinafter. When clock signal C0 applied to clock signal input terminal C attains a high level, bipolar transistor Q62 is turned on, and the data writing circuit is turned on. Bipolar transistor Q65 is turned off, and the data holding circuit is turned off. If the data signal (assumed to be ID1) applied to transistor Q60 attains a high level under this state, transistor Q60 is turned on and transistor Q61 is turned off. The current from constant current source CS23 flows to resistor R10 via Q60 and Q62. As a result, transistor Q67 provides a signal of a low level. No current flows in resistor R11 since transistor Q61 is turned off. Therefore, transistor Q66 provides a signal of a high level.

When clock signal C0 applied to clock signal input terminal C is brought to a low level from a high level (time t1 in FIG. 23), bipolar transistor Q65 is turned on, and the data holding circuit is turned on. Bipolar transistor Q62 is turned off, and the data writing circuit is turned off. Bipolar transistors Q63 and Q64 have their base terminals and collector terminals cross-coupled to each other. Data signal ID1 applied during a high level of clock signal C0 causes transistor Q63 to be turned on and transistor Q64 to be turned off. Therefore, data signal ID1 is maintained. Transistors Q66 and Q67 continue to output the same value when clock signal C0 attains a high level.

As described above, latch circuit 113 enters data when clock signal C0 attains a high level, and maintains the data when clock signal C0 attains a low level.

In FIG. 20, flipflop circuit 112 and latch circuits 113 and 114 form an internal clock generation circuit 111. Since flipflop circuit 112 has inversion output QB connected to data input terminal D, the signal applied to clock output terminal C' is frequency-divided by a factor of 2 to be provided from data output terminal Q. Latch circuit 114 has inversion output QB connected to data input terminal D of latch circuit 113 according to a structure in which the operation of data entering and data holding is inverted by 180° with respect to latch circuit 113. Therefore, latch circuits 113 and 114 further frequency-divide by a factor of 2 the output signal of flipflop circuit 112. Thus, internal clock generation circuit 114 has a function of a ¼ frequency divider. By taking a complementary output of latch circuit 113 and a complementary output of latch circuit 114, 4 phases of overlap signals are obtained displaced in phase by 90° from each other with 4 times the cycle of clock signal C0 applied to clock signal input terminal C' as shown in (c)–(f) in FIG. 21.

The 4 phases of overlap signals C(0°)–C(270°) become the clock signals of flipflop circuits 115–118 connected in parallel to data signal input terminal D'. Data I serially applied to data input terminal D' is entered into flipflop circuits 115–118 by four overlap signals C(0°)–C(270°) displaced in phase by 90° from each other.

Flipflop circuits 119–122 are connected to the outputs of flipflop circuits 115–118, respectively. The data entered in flipflop circuits 115–118 are shifted and held according to the signal applied to clock input terminal C of flipflop circuits 119–122. Then, the data held in flipflop circuits 119–122 are entered into flipflop circuits 123–126 in synchronization with clock signal C(270°) to be output in parallel.

In a conventional multiplexer circuit 100, only one select signal SEL generated by counter circuit 110 is used. The hardware was great since four flipflop circuits 106–109 and three selector circuits 110–112 are required for selecting and shifting data. This results in a great power consumption and a large layout area.

In a conventional demultiplexer circuit 110, a 1:4 demultiplexer circuit was formed using only four overlap signals C(0°)–C(270°) generated by internal clock generation circuit 111. The hardware was great since three flipflop circuits per bit was required for selecting and shifting serially input data. The power consumption and the layout area were great.

SUMMARY OF THE INVENTION

In view of the foregoing, an object of the present invention is to provide a multiplexer circuit and a demultiplexer circuit with few hardware.

According to a first multiplexer circuit of the present invention, a select signal generation circuit generates M phases of select signals having different phases, and a selector circuit selects M parallel data signals of a bit one at a time according to the M phases of select signals to output a serial data signal of M bits. The number of hardware components can be reduced in comparison with the case where a select signal generation circuit generates only a select signal of 1 phase, and a plurality of flipflop circuits and a 2-input selector circuit carry out selection and shifting of parallel data signals.

According to a second multiplexer circuit of the present invention, a select signal generation circuit generates M phases of select signals differing in phase, and a switch signal generation circuit generates a switch signal. A selector circuit selects M/N parallel data signals of a bit one at the time according to M/N phases of select signals and outputs a serial data of M/N bits. A switch circuit responds to a switch signal to switch the output of N selector circuits to output a serial data signal of M bits. Therefore, similar to the first multiplexer circuit, the number of hardware components can be reduced. Furthermore, increase in the number of bits can readily be treated since the selector circuit is divided into a plurality of selector circuits.

In the first and second multiplexer circuits, the select signal generation circuit preferably includes M flipflop circuits connected in series and an OR circuit. According to this structure, M phases of select signals can easily be obtained having a cycle M times that of a clock signal and with no overlap between a high level (logical high) and a low level (logical low).

Preferably, a hold circuit is provided for temporarily holding an output of a select circuit and outputting the same in synchronization with an internal clock signal. As a result, the output is made to synchronize with a clock signal accurately.

According to a third multiplexer circuit of the present invention, a select signal generation circuit generates M/N phases of select signals differing in phase, and a switch signal generation circuit generates a switch signal. A selector circuit selects M/N parallel data signals of a bit one at a time according to M/N phases of select signals to output a serial data signal of M/N bits. The switch circuit switches the output of N selector circuits according to a switch signal to output a serial data signal of M bits. Similar to the first and second multiplexer circuits, the number of hardware components can be reduced and the number of bits increased. Furthermore, since the select signal generation circuit generates M/N phases of select signals, the select signal generation circuit can be reduced in size.

In the third multiplexer circuit, the select signal generation circuit preferably includes M/N flipflop circuits connected in series and an OR circuit. According to this structure, M/N phases of select signals are obtained having a cycle M times that of a clock signal with no overlap between a high level and a low level.

Preferably, a hold circuit is provided for temporarily holding an output of a selector circuit and outputting the same in synchronization with an internal clock signal. As a result, the output is made to synchronize with a clock signal accurately.

According to a first demultiplexer of the present invention, an internal clock generation circuit generates M phases of first internal clock signals differing in phase and a second internal clock signal. A data conversion unit receives first and second internal clock signal to enter one bit of data signal out of a serial data signal of M bits according to the first internal clock signal, and outputs that data signal as one bit data signal of parallel data signals of M bits according to a second internal clock signal. Therefore, the internal clock generation circuit generates only a first internal clock signal of a plurality of phases, so that the number of hardware components can be reduced in comparison with the conventional case where three flipflop circuits are used per bit.

According to a second demultiplexer circuit of the present invention, an internal clock generation circuit generates M phases of first internal clock signals differing in phase and a second internal clock signal. A flipflop circuit enters a data signal of 1 bit out of M bits of serial data signal according to an internal clock signal. A latch circuit enters an output of a corresponding flipflop circuit according to a second internal clock signal and outputs the same. Similar to the first demultiplexer circuit of the present invention, the number of hardware components can be reduced.

In the first and second demultiplexer circuits, an internal clock generation circuit preferably includes a flipflop circuit, M/2 latch circuits connected in series, and an OR circuit. According to this structure, first internal signals of M phases having a cycle M times that of a clock signal and with no overlap between a high level and a low level and a second internal signal can easily be obtained.

Preferably, an internal clock generation circuit includes M flipflop circuits connected in series, an OR circuit, and an AND circuit. According to this structure, M phases of first internal clock signals having a cycle M times that of a clock signal and with no overlap between a high level and a low level, and a second internal clock signal are easily obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
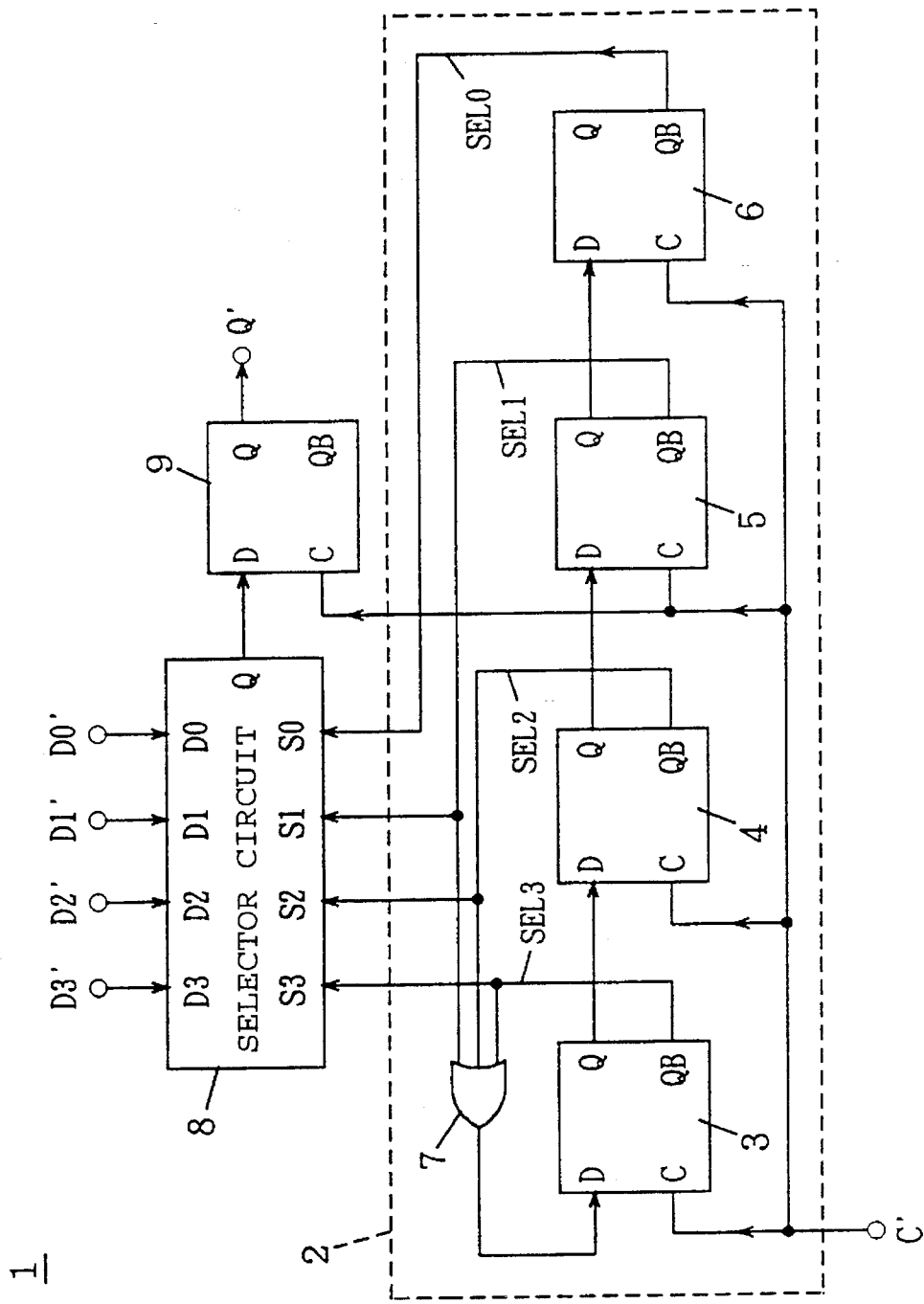
FIG. 1 is a block diagram showing a structure of a 4:1 multiplexer circuit according to Embodiment 1 of the present invention.
Figure 2:
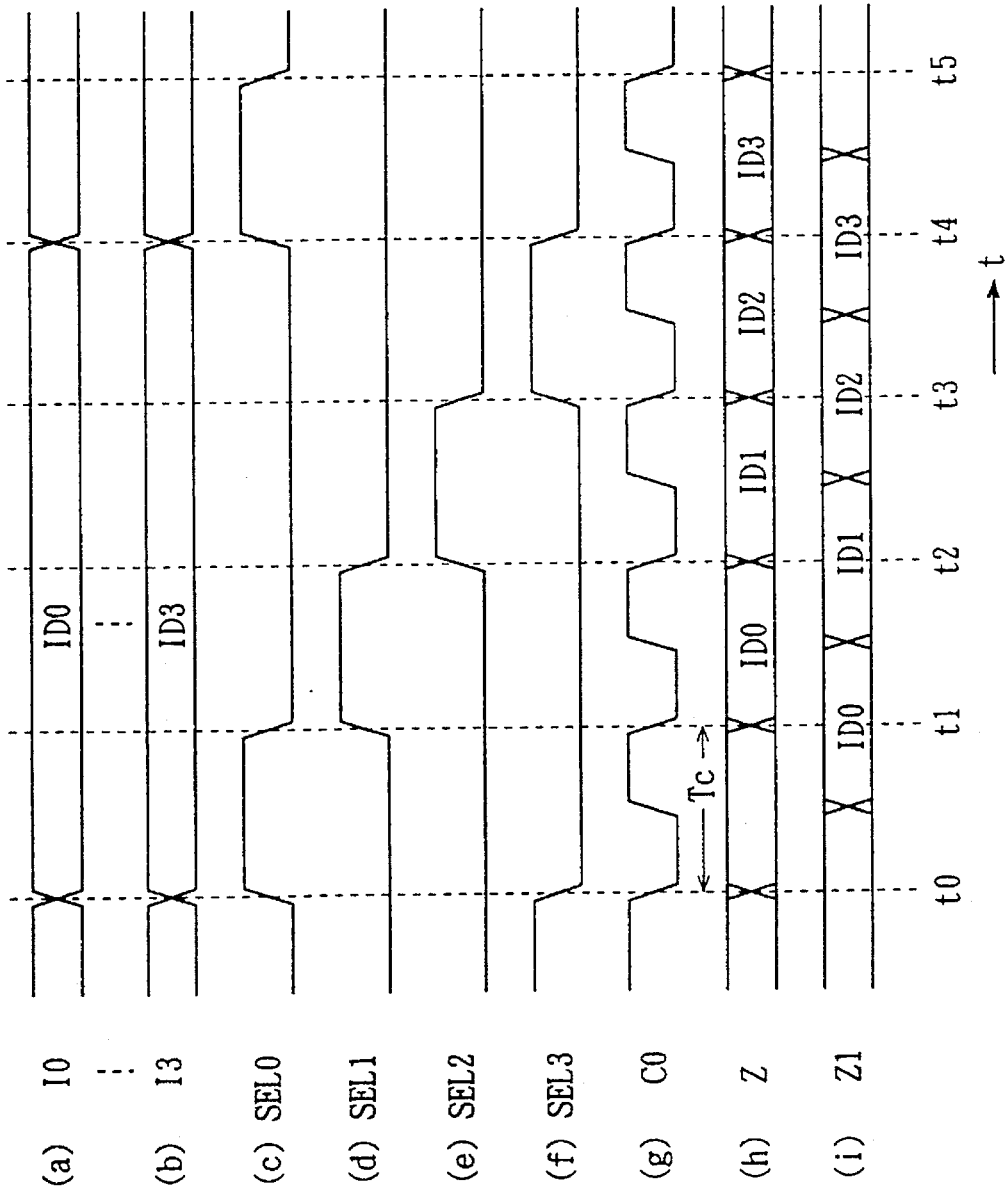
FIG. 2 is a timing chart showing an operation of the 4:1 multiplexer circuit of FIG. 1.

FIGS. 1 and 2 are a block diagram and a timing chart showing the structure and operation, respectively, of a 4:1 multiplexer circuit 1 according to Embodiment 1 of the present invention. Referring to FIG. 1, a 4:1 multiplexer circuit 1 includes a clock signal input terminal C', data signal input terminals D0'–D3', and a data signal output terminal Q'. A clock signal C0 is applied to clock signal input terminal C'. As shown in FIG. 2($g$), clock signal C0 attains a low level or a high level for every half cycle Tc/2. Data signals I0–I3 are applied to data signal input terminals D0'–D3', respectively. As shown in ($a$) and ($b$) in FIG. 2, data signals I0–I3 attain a high level or a low level in synchronization with the fall of clock signal C0 at a cycle of 4Tc which is four times that of clock signal C0.

4:1 multiplexer circuit 1 includes flipflop circuits 3–6 and 9, a 3-input OR gate 7 and a 4-input selector circuit 8.

Figure 3:
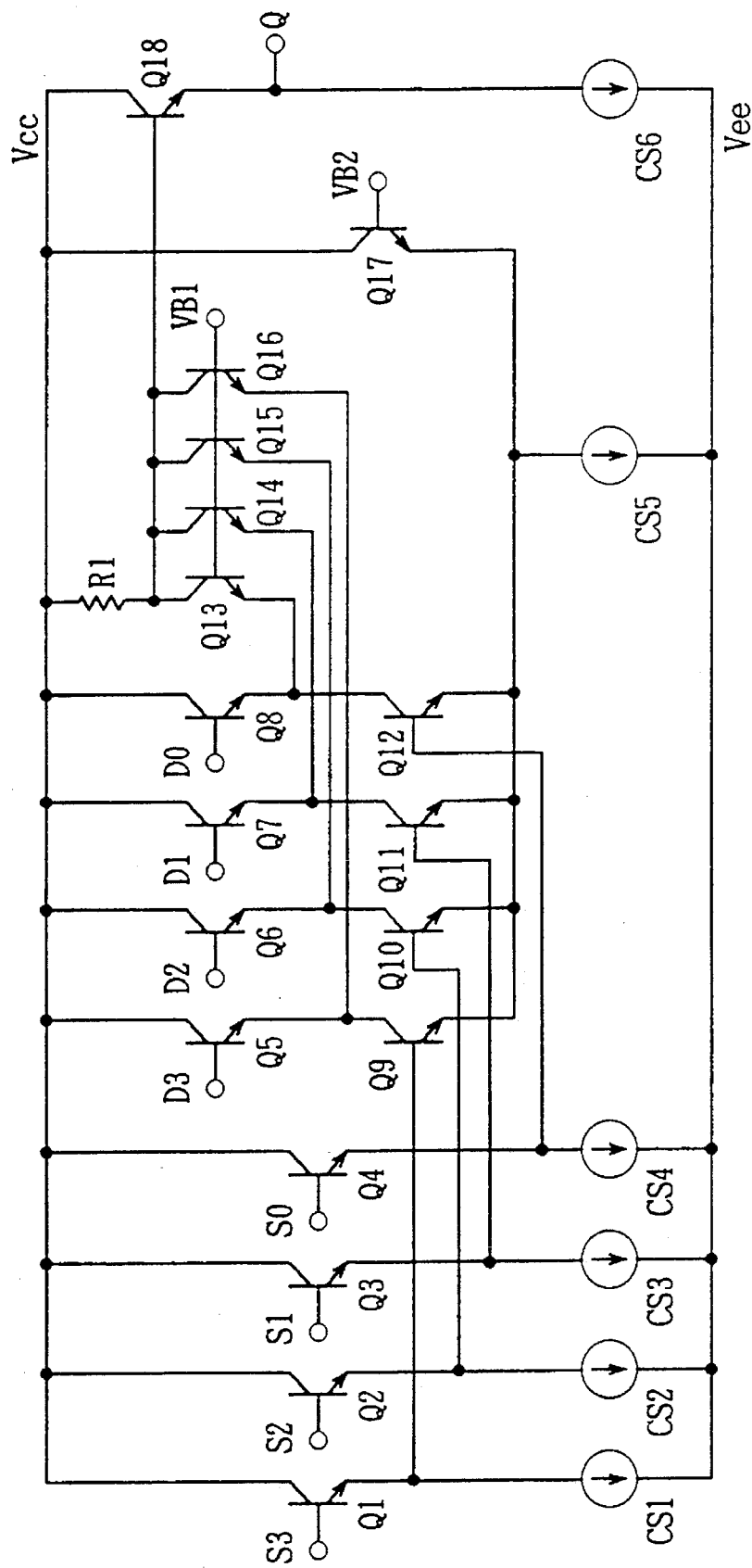
FIG. 3 is a circuit diagram showing a structure of a 4-input selector circuit of the 4:1 multiplexer circuit of FIG. 1.

FIG. 3 is a circuit diagram showing a structure of 4-input selector circuit 8. Referring to FIG. 3, 4-input selector circuit 8 includes four select signal input terminals S0–S3, four data signal input terminals D0–D3, a data signal output terminal Q, first and second reference potential terminals VB1, VB2, and first and second power supply terminals Vcc and Vee. A data signal is applied to each of data signal input terminals D0–D3. Four phases of signals with no overlap of the high level are applied to select signal input terminals S0–S3. (As will be described afterwards, select signals SEL0–SEL3 from counter circuit 2 are entered in the present embodiment.)

A threshold potential of a logic amplitude of a data signal applied to data signal input terminals D0–D3 is applied to first reference potential terminal VB1. A threshold potential of a logic amplitude of the signal entered into select signal input terminals S0–S3 is applied to second reference voltage signal VB2.

4-input selector circuit 8 includes bipolar transistors Q1–Q18, a resistor R1, and constant current sources CS1–CS6. Transistors Q1–Q4 have their bases connected to select signal input terminals S3, S2, S1, and S0, respectively, their collectors all connected to first power supply terminal Vcc, and their emitters connected to first power supply potential Vee via constant current sources CS1–CS4, respectively. Transistors Q5–Q8 have their bases connected to data signal input terminals D3, D2, D1, and D0, respectively, their collectors all connected to first power supply potential Vcc, and their emitters connected to the emitters of transistors Q16, Q15, Q14, and Q13, respectively, as well as to the collectors of transistors Q9–Q12, respectively. Transistors Q13–Q16 have their bases connected to first reference potential terminal VB1, and their collectors connected to first power supply terminal Vcc via resistor R1.

Transistors Q9–Q12 have their bases connected to the emitters of transistors Q1–Q4, respectively. The commonly-connected emitters of transistors Q9–Q12 are connected to second power supply terminal Vee via constant current source CS5. Transistors Q17 has its base connected to first reference voltage terminal VB2, its collector connected to first power supply terminal Vcc, and its emitter connected to the emitters of transistors Q9–Q12. Transistor Q18 has its base connected to the collectors of transistors Q13–Q16, its collector connected to first power supply terminal Vcc, and its emitter connected to data signal output terminal Q as well as to second power supply terminal Vee via constant current source CS6.

The operation of the 4-input selector circuit of FIG. 3 will be described hereinafter. When a signal of a high level, for example, is applied to select signal input terminal S0, bipolar transistor Q12 is turned on and transistors Q9–Q11, Q17 are turned off. When a signal of a high level is applied to data signal input terminal D0 under this state, transistor Q8 is turned on and transistor Q13 is turned off, whereby the current determined by constant current source CS5 flows via transistors Q8 and Q12. Current does not flow in transistor Q13, so that the base potential of transistor Q18 attains a high level. Therefore, data signal output terminal Q provides a signal of a high level.

When a signal of a low level is applied to data signal input terminal D0, transistor Q8 is turned off and transistor Q13 is turned on, whereby the current from constant current source CS5 flows through resistor R1 via transistors Q12 and Q13. Therefore, the base potential of transistor Q18 attains a low level, whereby data signal output terminal Q provides a signal of a low level.

Similarly, when select signal input terminal S1 attains a high level, bipolar transistor Q11 is on, and bipolar transistors Q9, Q10, Q12, Q17 are off. The signal applied to data signal input terminal D1 is provided to data signal output terminal Q via transistor Q18. The signal applied to data signal input terminal D2 and the signal applied to data signal input terminal D3 are provided to data signal output terminal Q when select signal input terminal S2 attains a high level select and signal input terminal S3 attains a high level, respectively. Thus, 4-input selector circuit 8 selects and outputs an input data signal according to a select signal.

Figure 4:
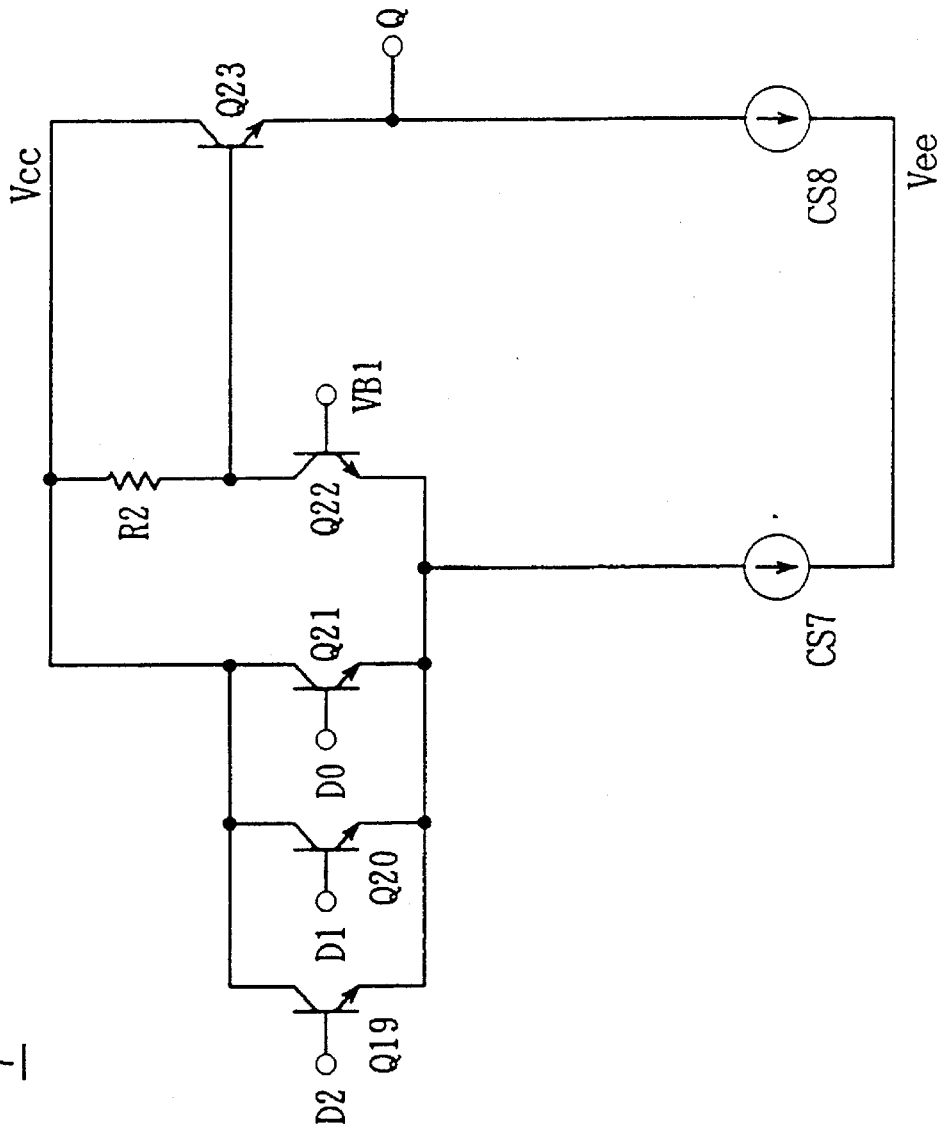
FIG. 4 is a circuit diagram showing a structure of a 3-input OR gate of the 4:1 multiplexer circuit of FIG. 1.

FIG. 4 is a circuit diagram showing a structure of 3-input OR gate 7. Referring to FIG. 4, 3-input OR gate 7 includes data signal input terminals D0–D2, data signal output terminal Q, first reference potential terminal VB1, and first and second power supply terminals Vcc and Vee. A threshold potential of a logic amplitude of the signal applied to data signal input terminals D0–D2 is sent to first reference potential terminal VB1.

3-input OR gate 7 includes bipolar transistors Q19–Q23, a resistor R2, and constant current sources CS7 and CS8. Transistors Q19–Q21 have their bases connected to data signal input terminals D2, D1, D0, respectively, their collectors all connected to first power supply terminal Vcc, and their commonly-connected emitters connected to second power supply terminal Vee via constant current source CS7. Transistor Q22 has its base connected to first reference potential terminal VB1, its collector connected to first power supply terminal Vcc via resistor R2, and its emitter connected to the emitters of transistors Q19–Q21. Transistor Q23 has its base connected to the collector of transistor Q22, its collector connected to first power supply terminal Vcc, and its emitter connected to data signal output terminal Q as well as to second power supply potential Vee via constant current source CS8.

The operation of 3-input OR gate 7 of FIG. 4 will be described hereinafter. When any of the signals applied to data signal input terminals D0–D2 attains a high level, current from constant current source CS7 flows to any of transistors Q19–Q21 which is turned on. Transistor Q22 is off, and no current flows in resistor R2. As a result, data signal output terminal Q provides a signal of a high level. Thus, this gate forms a 3-input OR logic.

In FIG. 1, flipflop circuits 3–6 and 3-input OR gate 7 form a counter circuit 2 of 4 bits (a number of bits identical to the number of bits of data signals entered in parallel). Counter circuit 2 outputs four select signals SEL0–SEL3 which are four phases of nonoverlap signals (a signal in which either a high level or a low level does not overlap; in the present embodiment, no overlapping in the high level) having a cycle four times that of a clock signal as shown in (c)–(f) in response to a clock signal C0 of (g) in FIG. 2. Since each output Q of flipflop circuits 3–5 forming counter circuit 2 is sequentially applied to input D of the flipflop circuit of the next stage, data is shifted for every cycle of clock signal C0. Flipflop circuit 6 shifts the data of flipflop circuit 5 for only 1 cycle of clock signal C0. Since 3-input OR gate 7 receives inverted output QB of three flipflop circuits 3–5, a signal of a low level is output for only one cycle during the four cycles of clock signal C0. Thus, by taking the inverted output QB of each of flipflop circuits 6, 5, 4, and 3, four phases of select signals SEL0–SEL3 are obtained in which the high level do not overlap each other as shown in (c)–(f) in FIG. 2.

The four phases of select signals SEL0–SEL3 are entered into select signal input terminals S0–S3, respectively, in 4-input selector circuit 8. Data signals I0–I3 entered in parallel to data signal input terminals D0'–D3', respectively, are sequentially selected by selector circuit 8 to be output as serial data. Output Q of 4-input selector circuit 8 is connected to input D of flipflop circuit 9. Data Z is output via flipflop circuit 9. More specifically, 4-input selector circuit 8 receives data signals I0–I3 of four bits and corresponding 4 bits of select signals SEL0–SEL3 from counter circuit 2 to output a data signal corresponding to the received select signals from data output terminal Q.

In the present embodiment, counter circuits 3–6 provide four phases of select signals SEL0–SEL3 to drive 4-input selector circuit 8. Thus, the number of hardware components is reduced in comparison with the conventional case where counter circuit 101 outputs a select signal SEL of 1 phase to drive three 2-input selector circuits 110–112. Thus, power consumption and the layout area are reduced.

Although inverted output QB of each of flipflop circuits 6, 5, 4, and 3 in 4-bit counter circuit 2, i.e., four phases of select signals SEL0–SEL3 having high level which do not overlap each other, are used, four phases of select signals having a low level which does not overlap each other, i.e. output Q of flipflop circuits 6, 5, 4, and 3, may be used. In this case, the four emitter follower circuits of transistor Q1 and constant current source CS1, transistor Q2 and constant current source CS2, transistor Q3 and constant current source CS3, and transistor Q4 and constant current source CS4 in 4-input selector circuit 8 of FIG. 3 are substituted with respective inverter circuits.

The present invention is not limited to the above-described embodiment where flipflop circuit 9 has a circuit structure identical to that of flipflop circuits 3–6 in FIG. 1. Flipflop circuit 9 may have a structure where the phase for clock signal C0 is displaced by 180° so that data is entered into the master circuit when clock signal C0 attains a low level, and the data is updated by the slave circuit when clock signal C0 attains a high level. In this case, the output of flipflop 9 is as shown in Z1 of FIG. 2(*i*).

In the present embodiment, a 4:1 multiplexer circuit is taken as an example. The present invention is also applicable to similar multiplexer circuits such as a 8:1 multiplexer circuit by using a 8-bit counter and a 8-input selector circuit, or a 16:1 multiplexer circuit using a 16-bit counter and a 16-input selector.

Furthermore, the present invention is not limited to the above-described embodiment where a bipolar transistor is used as a semiconductor device, and a MOS transistor or a GaAs transistor may be used.

Embodiment 2

Figure 5:
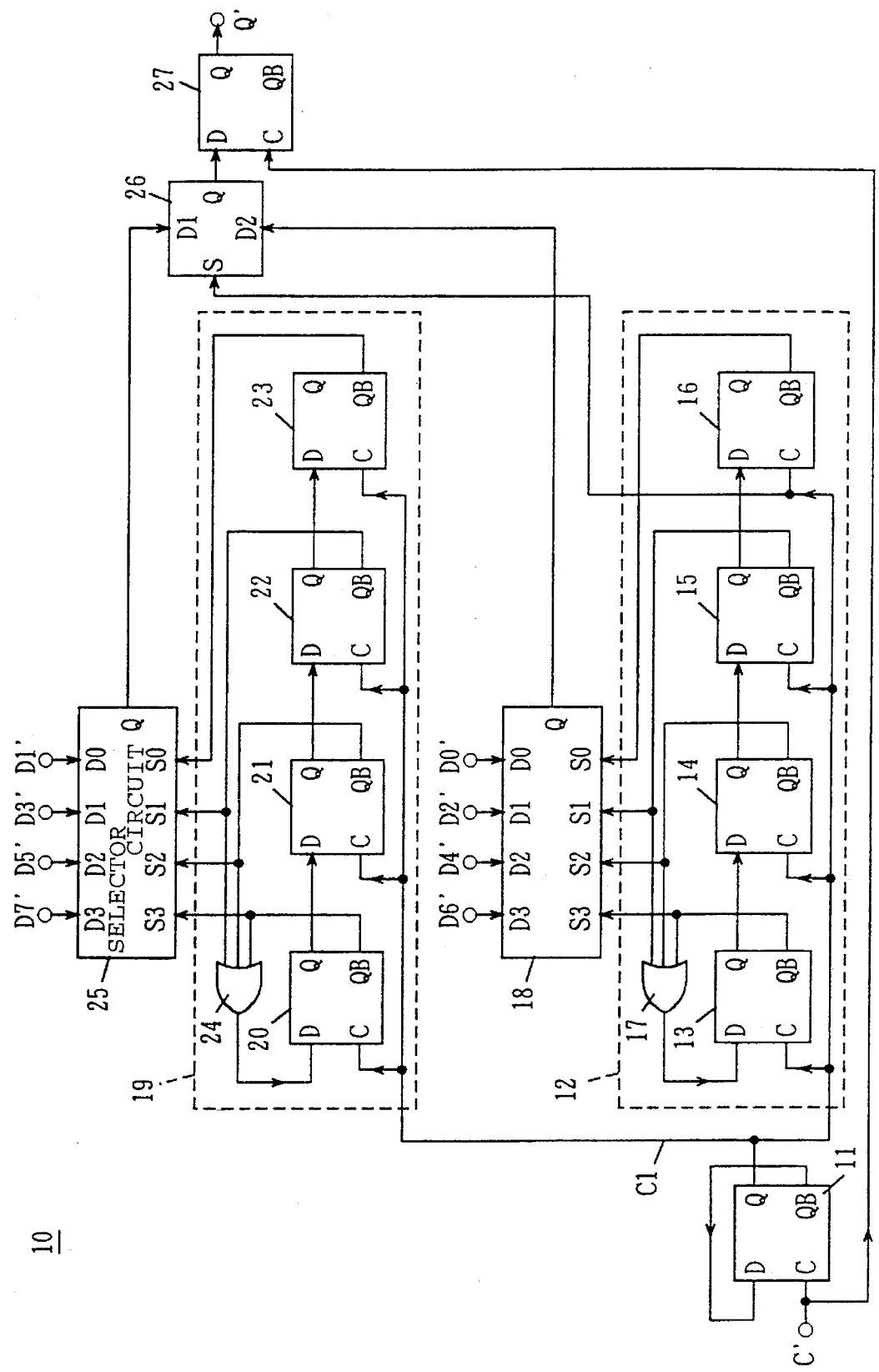
FIG. 5 is a block diagram showing a structure of a 8:1 multiplexer circuit according to Embodiment 2 of the present invention.
Figure 6:
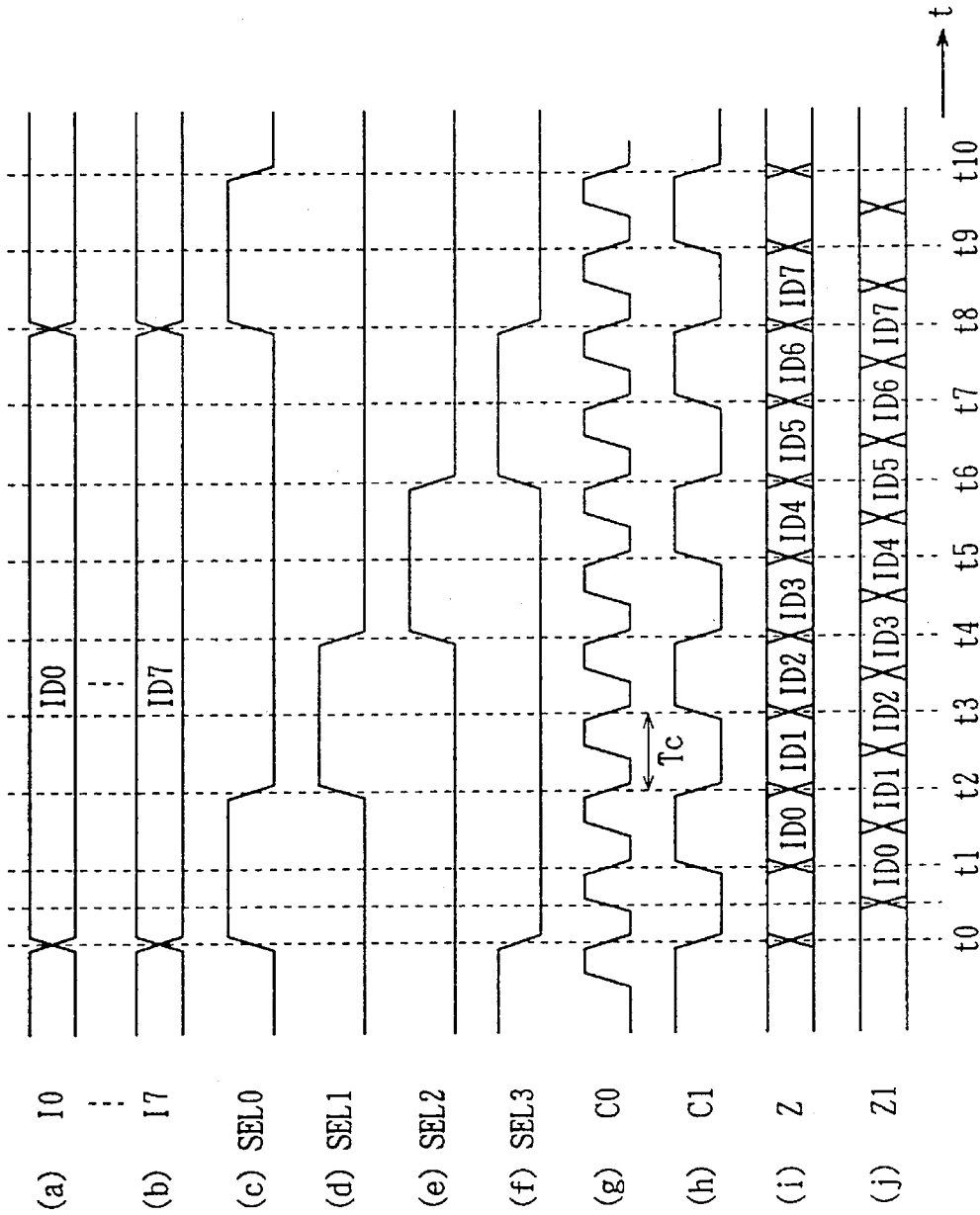
FIG. 6 is a timing chart showing the operation of the 8:1 multiplexer circuit of FIG. 5.

FIGS. 5 and 6 are a circuit diagram and a timing chart showing the structure and the operation, respectively, of a 8:1 multiplexer circuit 10 according to Embodiment 2 of the present invention. Referring to 5, 8:1 multiplexer circuit 10 includes a clock signal input terminal C', a data signal input terminals D0'–D7', and a data signal output terminal Q'. Clock signal input terminal C' receives a clock signal C0. Clock signal C0 attains a low level or a high level for every half cycle Tc/2 as shown in FIG. 6(*g*). Data signal input terminals D0'–D7' receive data signals I0–I7, respectively. Data signals I0–I7 attain a high level or a low level at a cycle 8Tc which is eight times that of clock signal C0 in synchronization with a fall of clock signal C0 as shown in (*a*) and (*b*) in FIG. 6.

Figure 16:
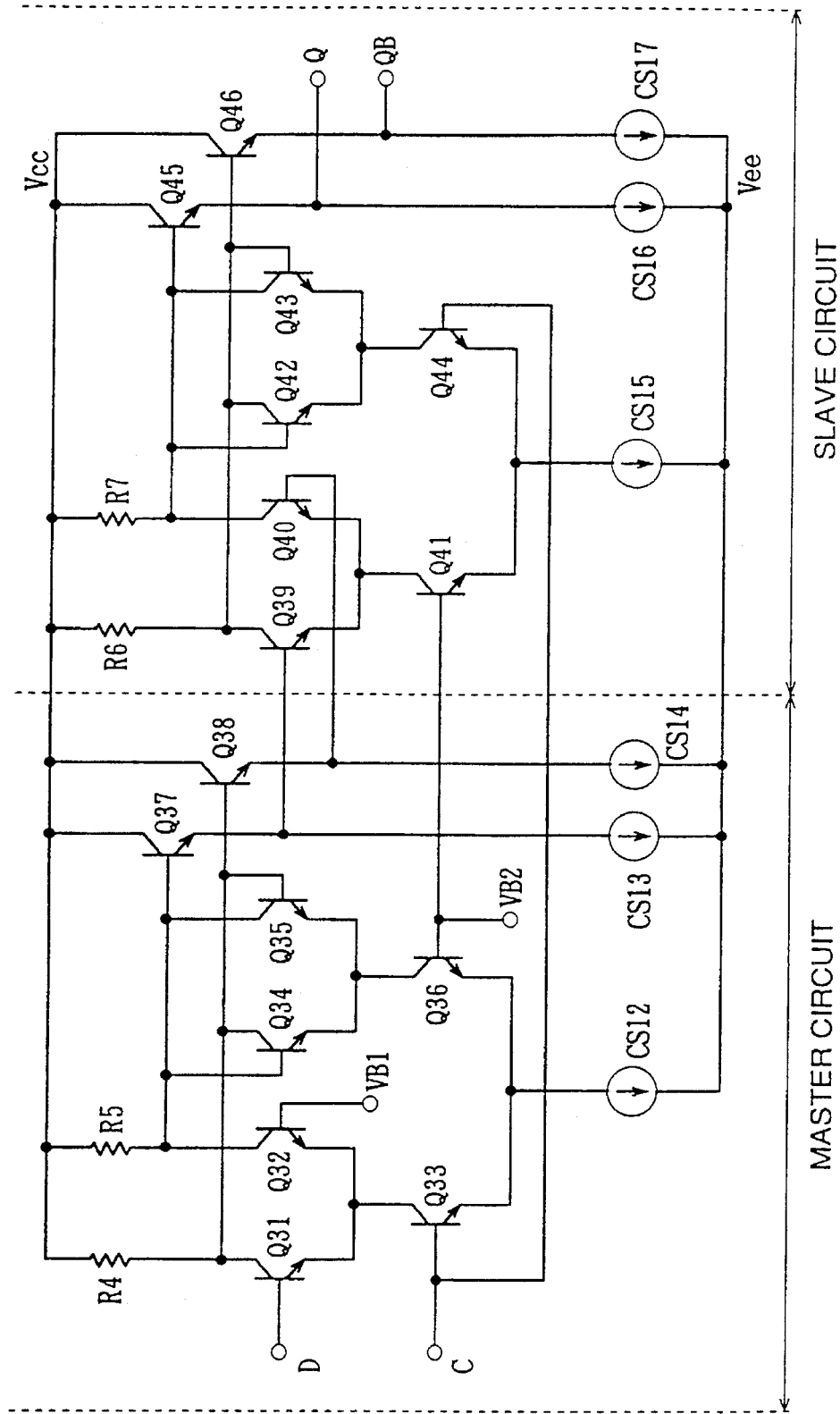
FIG. 16 is a circuit diagram showing a structure of a flipflop circuit of the 4:1 multiplexer circuit of FIG. 14.
Figure 17:
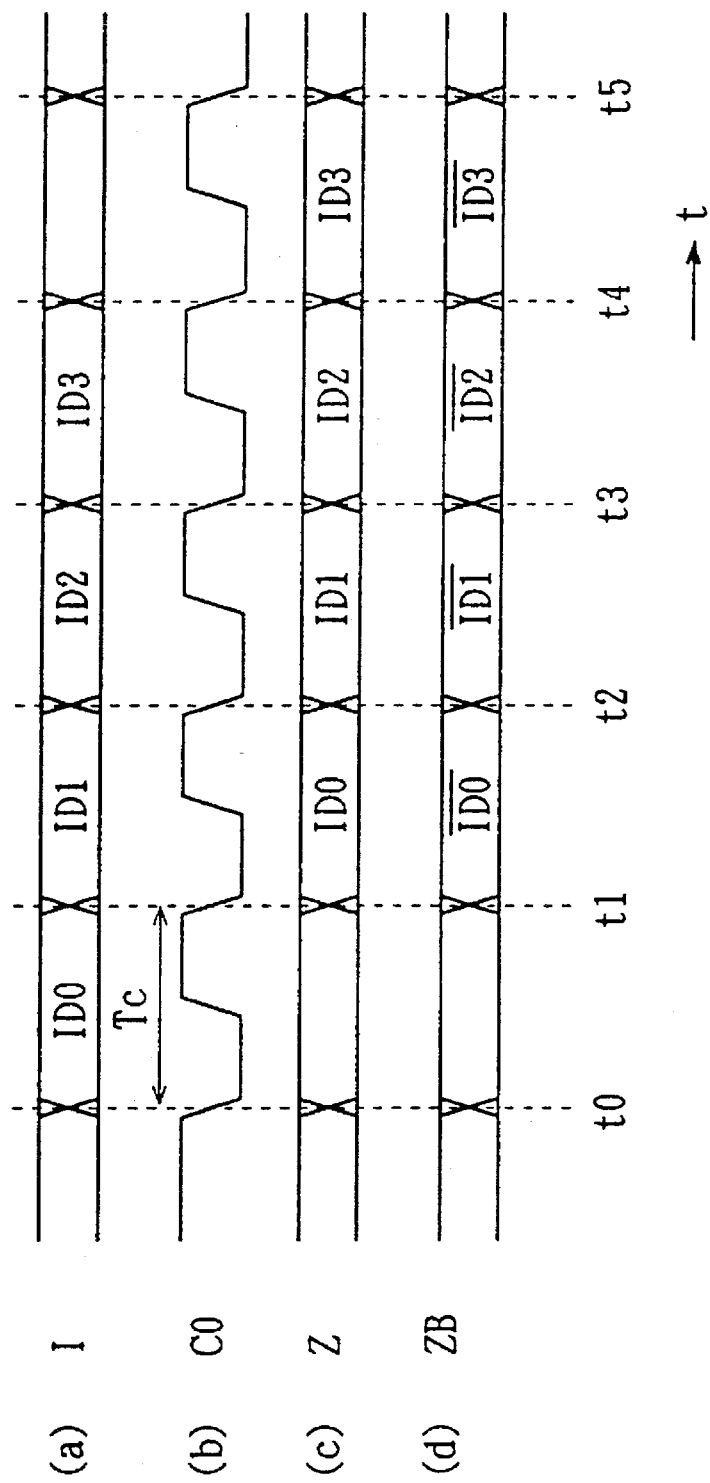
FIG. 17 is a timing chart showing the operation of the flipflop circuit of FIG. 16.
Figure 18:
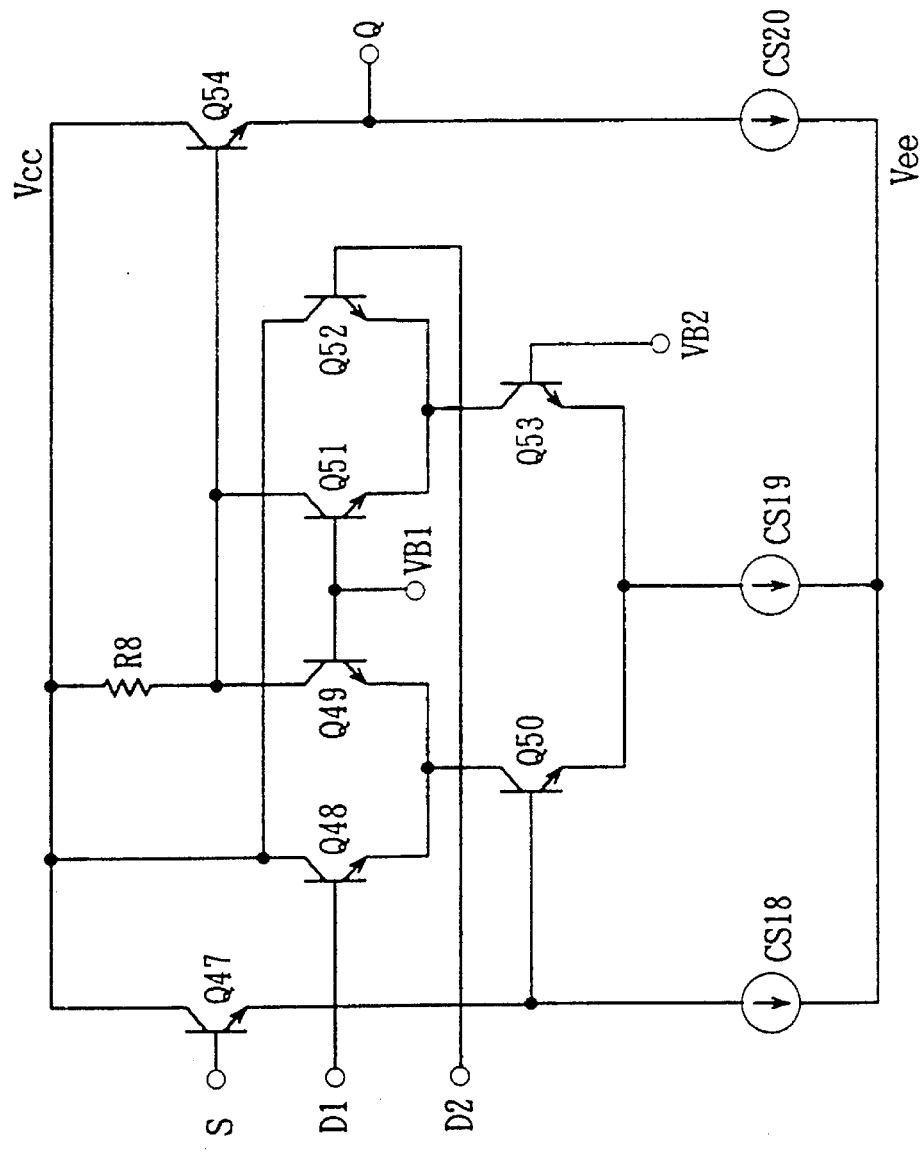
FIG. 18 is a circuit diagram showing a structure of a 2-input selector circuit of the 4:1 multiplexer circuit of FIG. 14.
Figure 19:
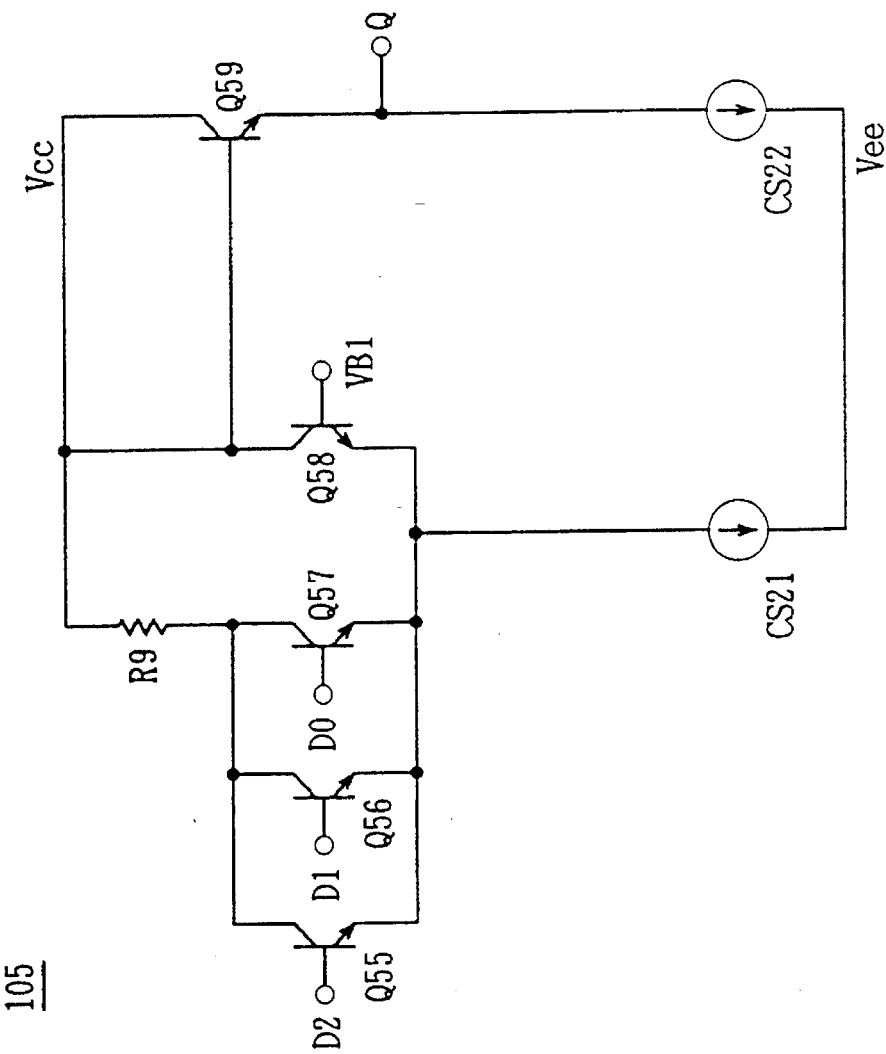
FIG. 19 is a circuit diagram showing a structure of a 3-input NOR gate of the 4:1 multiplexer circuit of FIG. 14.
Figure 20:
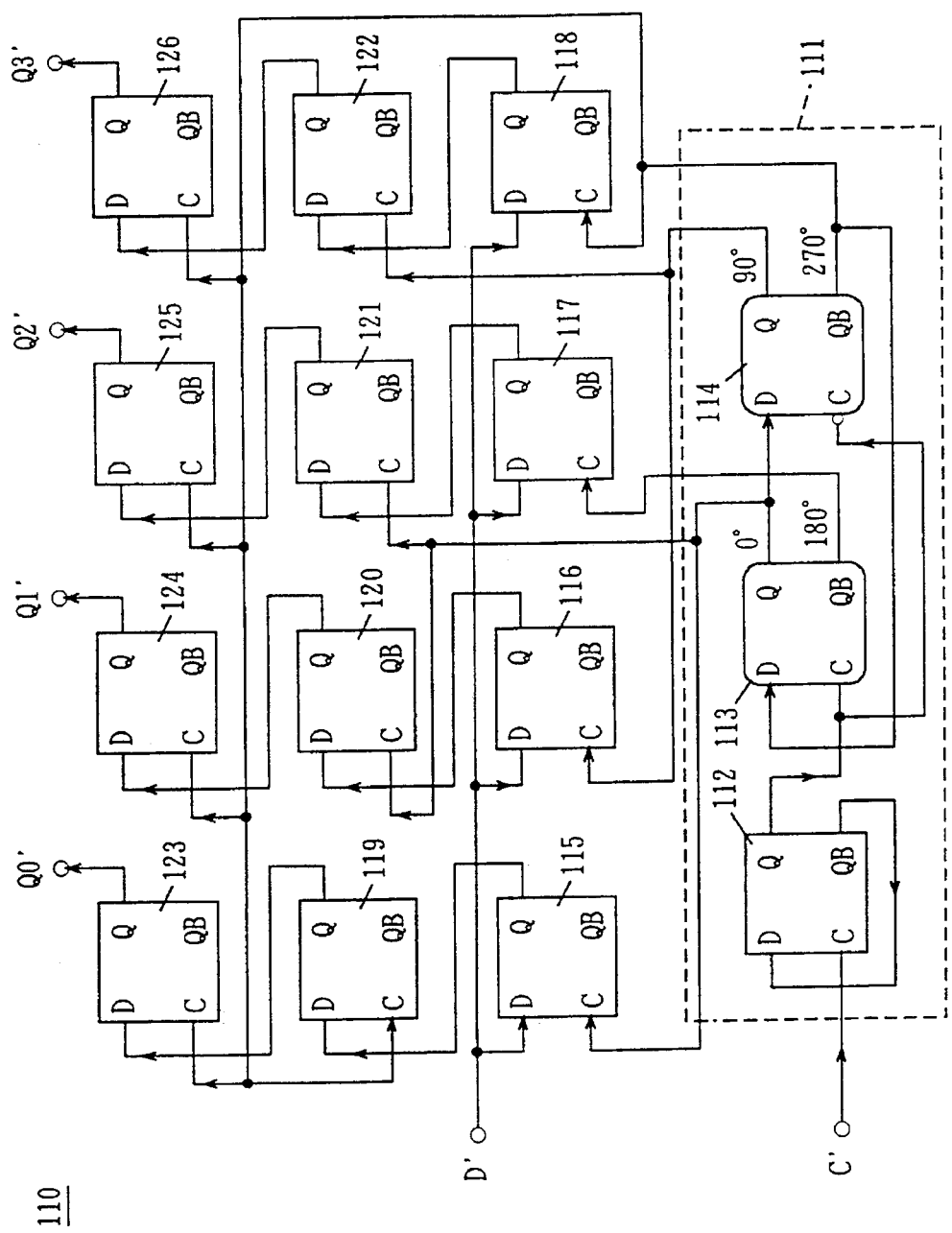
FIG. 20 is a block diagram showing a structure of a conventional 1:4 demultiplexer circuit.
Figure 21:
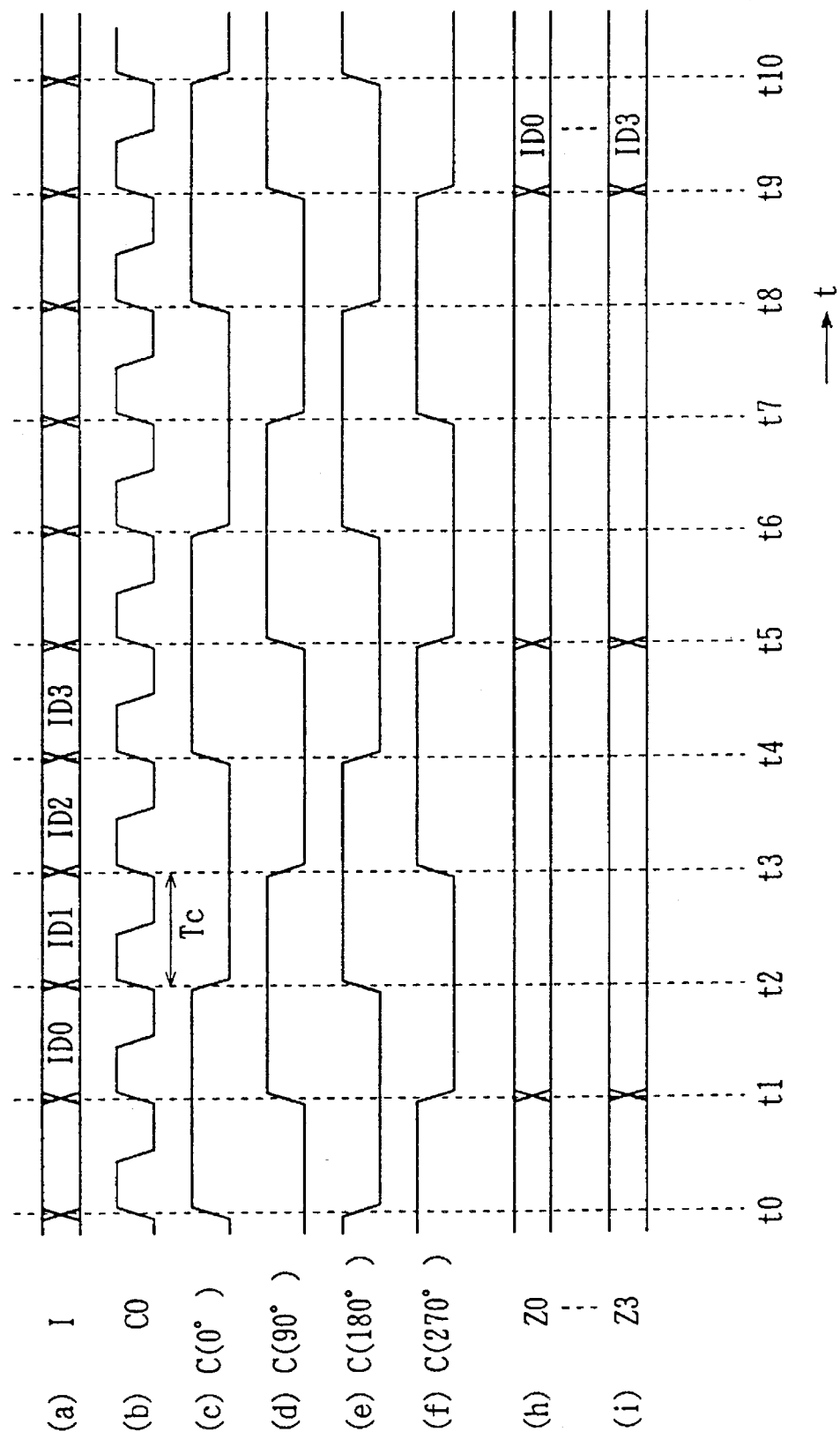
FIG. 21 is a timing chart showing the operation of the 1:4 demultiplexer circuit of FIG. 20.

8:1 multiplexer circuit 10 includes flipflop circuits 11, 13–16, 20–23, and 27 having a structure shown in FIG. 16, 3-input OR gates 17 and 24 having a structure shown in FIG. 4, 4-input selector circuits 18 and 25 having a structure shown in FIG. 3, and a 2-input selector circuit 26 having a structure shown in FIG. 18.

The operation of 8:1 multiplexer circuit 10 will be described hereinafter. This 8:1 multiplexer circuit 10 uses two of the 4:1 multiplexer circuit of FIG. 1 in parallel. Flipflop circuit 11 frequency-divides clock signal C0 provided to clock signal input terminal C' by a factor of two and outputs the divided signal. Data signals I1, I3, I5 and I7 applied to data signal input terminals D1', D3', D5', and D7', respectively, are converted into serial data by 4-input selector circuit 25. Data signals I0, I2, I4 and I6 applied to data signal input terminals D0'–D2', D4' and D6', respectively, are converted into serial data by 4-input selector circuit 18.

Data signal output terminals Q of 4-input selector circuits 25 and 18 are connected to data signal input terminals D1 and D2 of 2-input selector circuit 28. The signal input to data signal input terminal D1 and data signal input terminal D2 is selected and output when clock signal C1 attains a high level and a low level, respectively. Therefore, the signals applied to data signal input terminals D1 and D2 are alternately selected. Output Q of 2-input selector circuit 26 is connected to input D of flipflop circuit 27. Serial data Z is output in synchronization with a fall of clock signal C0 applied to flipflop circuit 27.

According to the present embodiment, counter circuits 12 and 19 output four phases of select signals SEL0–SEL3 to drive 4-input selector circuits 18 and 25. Therefore, the number of hardware components is reduced in comparison with the conventional case where counter circuit 101 outputs only one select signal SEL to drive a plurality of 2-input selector circuits. Thus, power consumption and the layout area are reduced.

Similar to Embodiment 1, flipflop circuit 27 may take a structure where clock signal C0 is displaced in phase by 180° so that the master circuit enters the data when clock signal C0 attains a low level and the slave circuit updates the data when clock signal C0 attains a high level. In this case, the output of flipflop circuit 27 is as shown in Z1 in FIG. 6(*g*).

Embodiment 3

Figure 7:
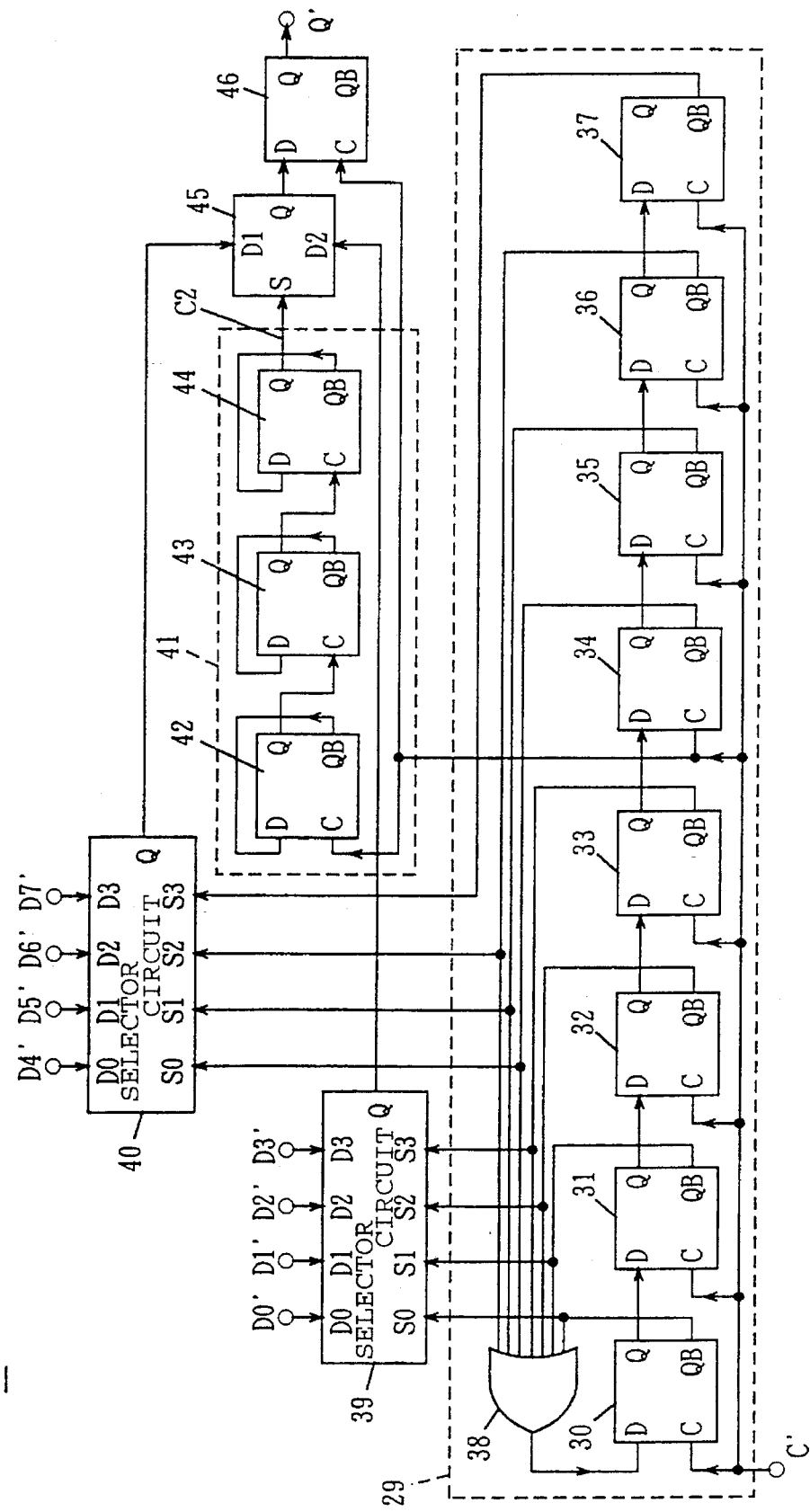
FIG. 7 is a block diagram showing a structure of a 8:1 multiplexer circuit according to Embodiment 3 of the present invention.
Figure 8:
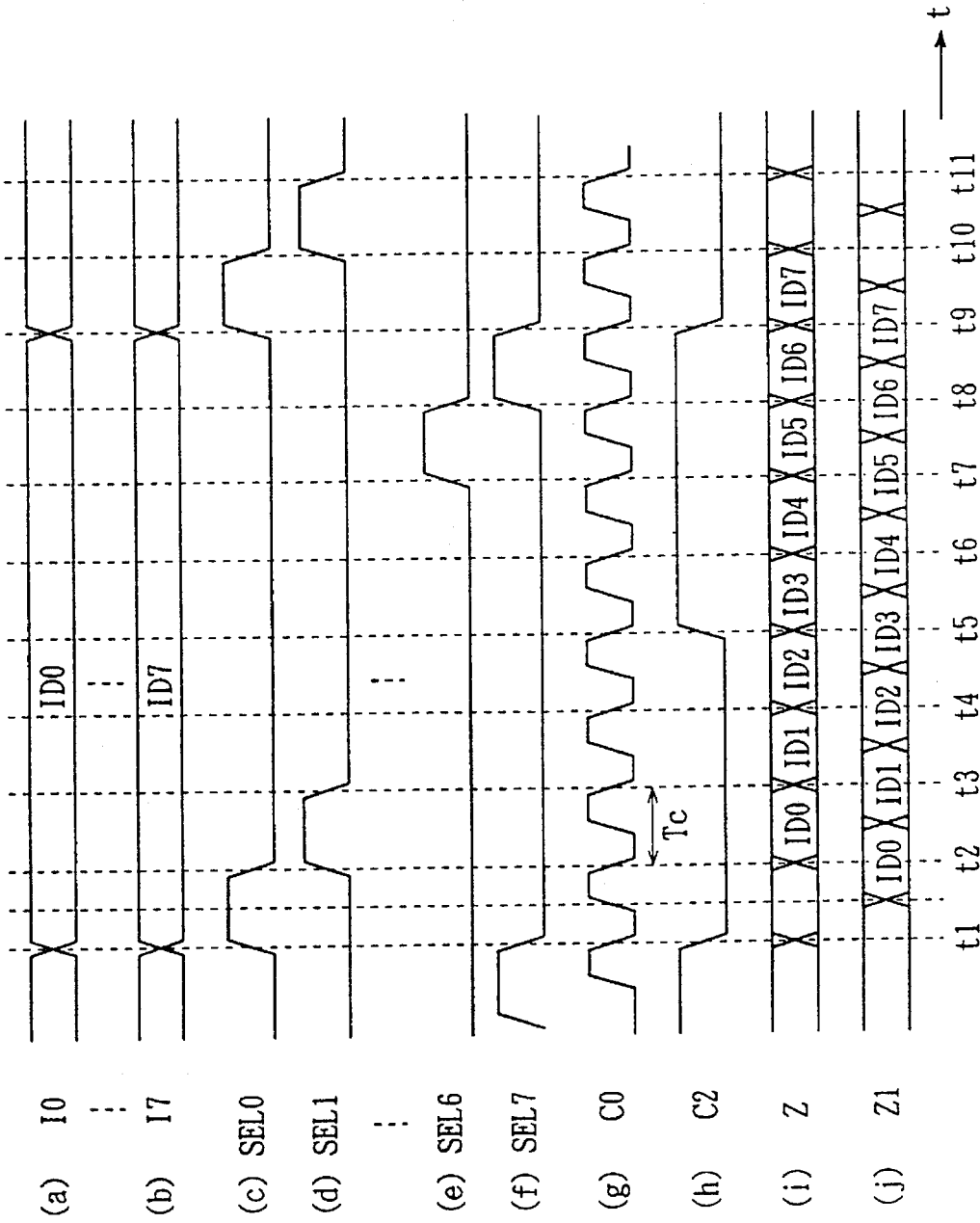
FIG. 8 is a timing chart showing the operation of the 8:1 multiplexer circuit of FIG. 7.

FIGS. 7 and 8 are a circuit diagram and a timing chart showing a structure and the operation of a 8:1 multiplexer circuit 28 according to Embodiment 3 of the present invention. Referring to FIG. 7, 8:1 multiplexer circuit 28 includes a clock signal input terminal C', data signal input terminals D0'–D7', and a data signal output terminal Q'. A clock signal C0 is applied to clock signal input terminal C'. Data signals I0–I7 are applied to data signal input terminals D0'–D7', respectively. As shown in FIG. 8(*g*), clock signal C0 attains a low level or a high level for every half cycle Tc/2. Data signal input signals I0–I7 attain a high level or a low level at a cycle 8Tc that is 8 times that of clock signal C0 in synchronization with a fall of clock signal C0 as shown in (*a*) and (*b*) in FIG. 8.

8:1 multiplexer circuit 28 includes a flipflop circuits 30–37, 42–44, 46 having a structure shown in FIG. 16, a 7-input OR gate 38 having a structure similar to that shown in FIG. 4 with 7 inputs in contrast to the 3 inputs of transistors, 4-input selector circuits 39 and 40 having a structure shown in FIG. 3, and a 2-input selector circuit 45 having a structure shown in FIG. 18.

Flipflop circuits 30–37 and 7-input OR gate 38 form a 8-bit counter circuit 29. Flipflop circuits 42–44 form a ⅛ frequency divider 41 to frequency-divide clock signal C0 applied to flipflop circuit 42 by a factor of 8 which is output as clock signal C2. Data signals I0–I3 applied to data signal input terminals D0'–D3' are converted into serial data by 4-input selector circuit 39. Data signals I4–I7 applied to data signal input terminals D4' and D7' are converted into serial data by 4-input selector circuit 40.

Data signal output terminals Q of 4-input selector circuits 39 and 40 are connected to data signal input terminals D2 and D1 of 2-input selector circuit 45. The signal input to data signal input terminal D1 and the signal input to data signal input terminal D2 are selected and output when clock signal C2 applied to 2-input selector circuit 45 attains a high level and a low level, respectively. Therefore, the signals applied to data signal input terminals D1 and D2 are alternately selected for every 4 bits. Output Q of 2-input selector circuit 45 is connected to input D of flipflop circuit 46. Serial data Z is output in synchronization with a fall of clock signal C0 applied to flipflop circuit 12.

According to the present embodiment, counter circuit 29 outputs 8 phases of select signals SEL0–SEL7 to drive 4-input selector circuits 39 and 40. Therefore, the number of hardware components is reduced in comparison with the conventional case where counter circuit 101 outputs only one select signal SEL to drive a plurality of 2-input selector circuits. Therefore, power consumption and the layout area can be reduced.

Similar to Embodiment 1, the present embodiment may have the structure of flipflop circuit 46 formed so that the clock signal is displaced in phase by 180° so that the master circuit enters data when the clock signal attains a low level and the slave circuit updates the data when the clock signal attains a high level. In this case, the output of flipflop circuit 46 is as shown Z1 in FIG. 6(*j*).

Embodiment 4

Figure 9:
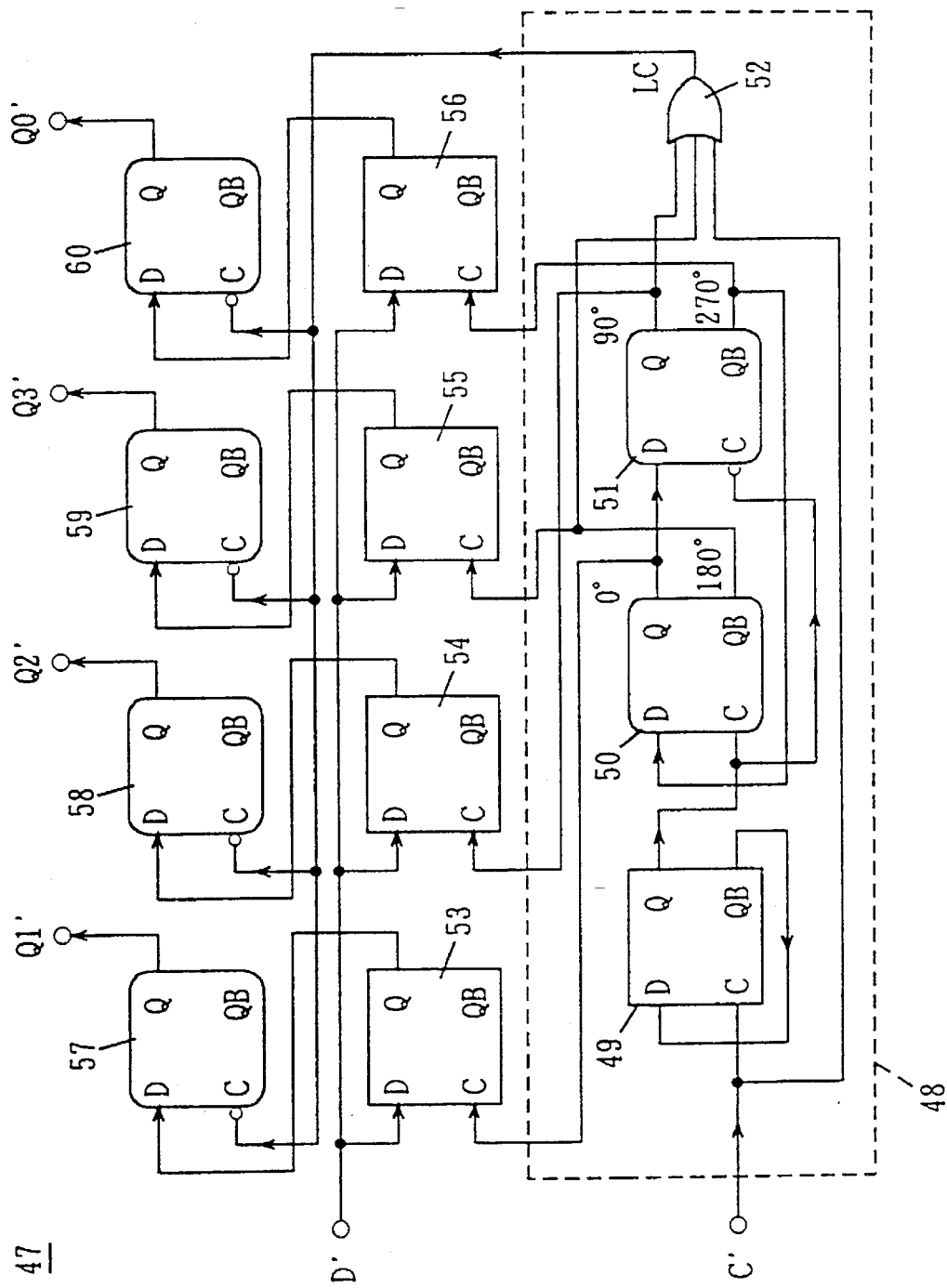
FIG. 9 is a block diagram showing a structure of a 1:4 demultiplexer circuit according to Embodiment 4 of the present invention.
Figure 10:
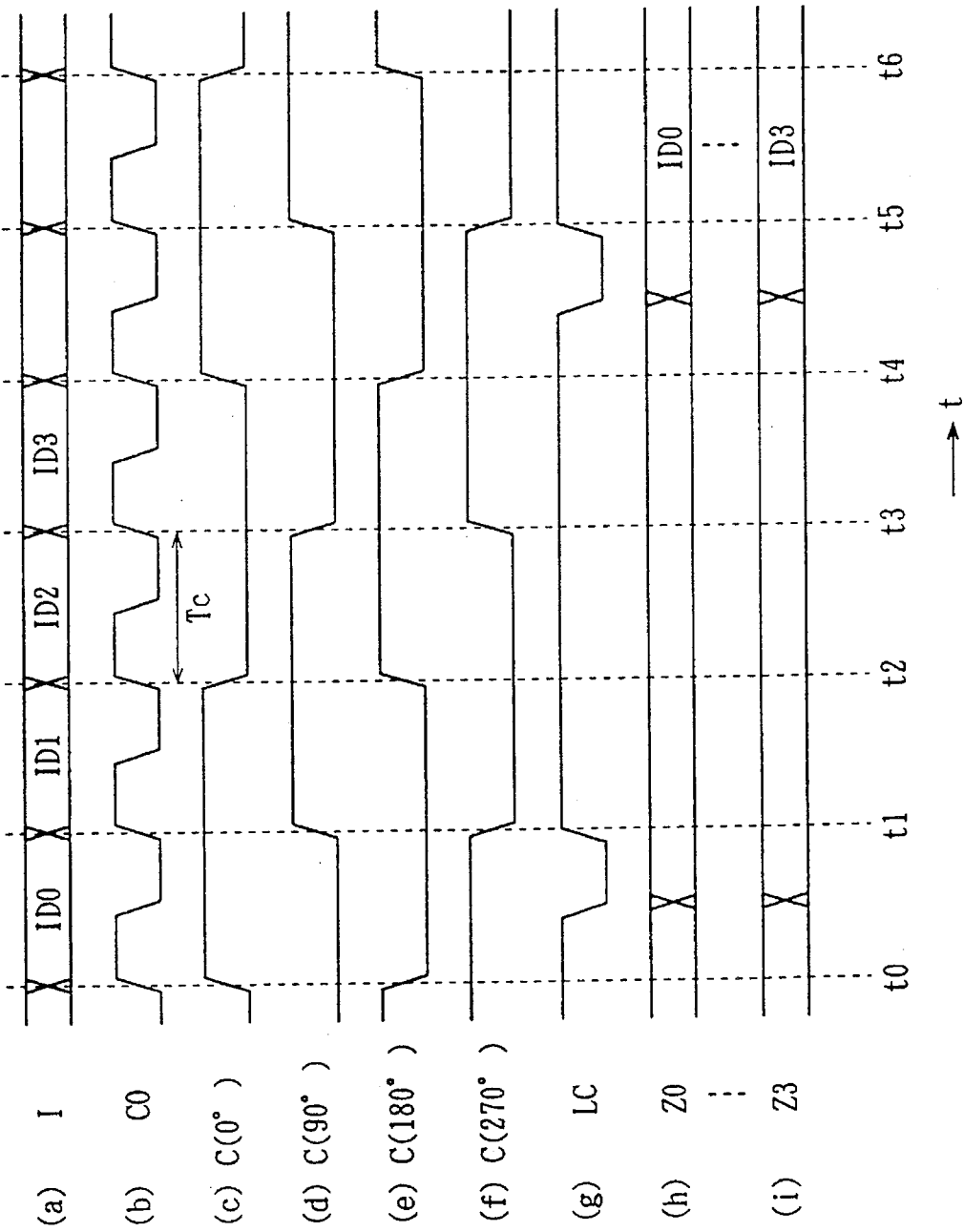
FIG. 10 is a timing chart showing the operation of the 1:4 demultiplexer circuit of FIG. 9.

FIGS. 9 and 10 are a block diagram and a timing chart showing the structure and operation, respectively, of a 1:4 demultiplexer circuit 47 according to Embodiment 4 of the present invention. Referring to FIG. 9, 1:4 demultiplexer circuit 47 includes a clock signal input terminal C', a data signal input terminal D', and data signal output terminals Q0'–Q3'. Clock signal input terminal C' receives a clock signal C0, and data signal input terminal D' receives data signal I. As shown in FIG. 10(b), clock signal C0 attains a high level or a low level for every half cycle Tc/2. Data signal I attains a high level or a low level at a cycle Tc identical to that of clock signal C0 in synchronization with a rise of clock signal C0 as shown in FIG. 10(a).

Figure 22:
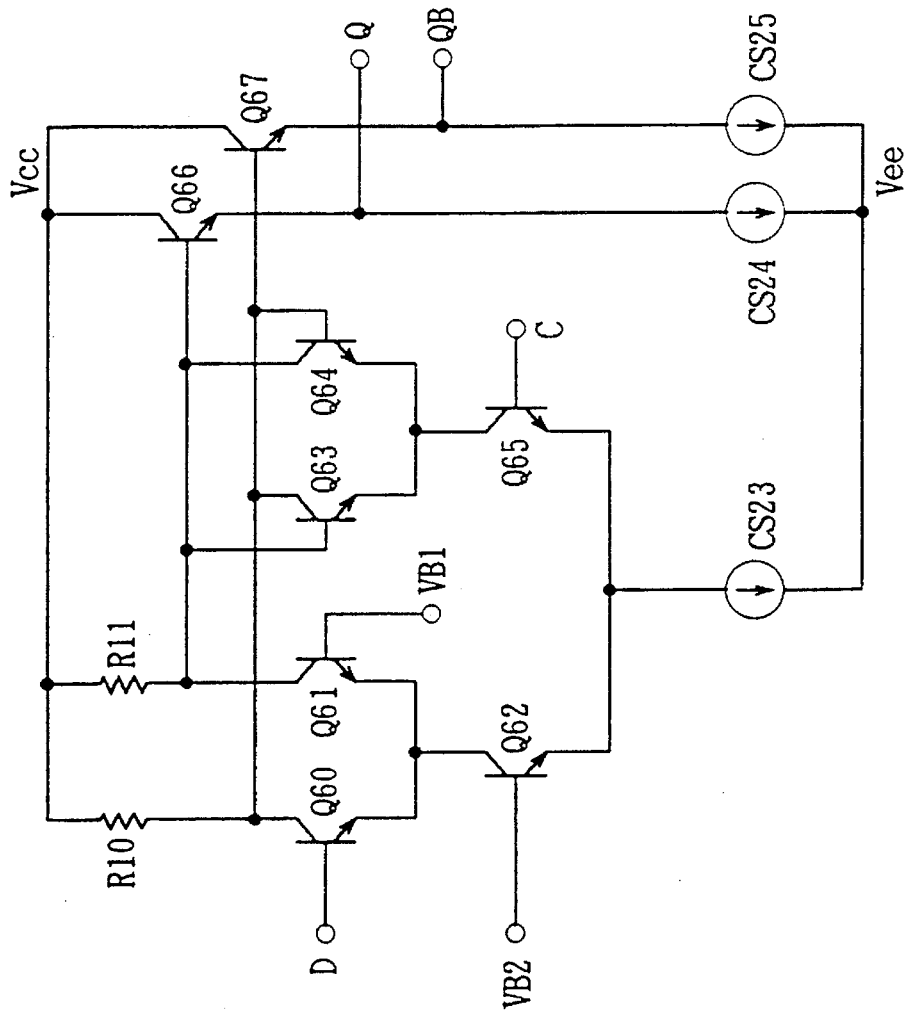
FIG. 22 is a circuit diagram showing a structure of a latch circuit of the 1:4 demultiplexer circuit of FIG. 20.
Figure 23:
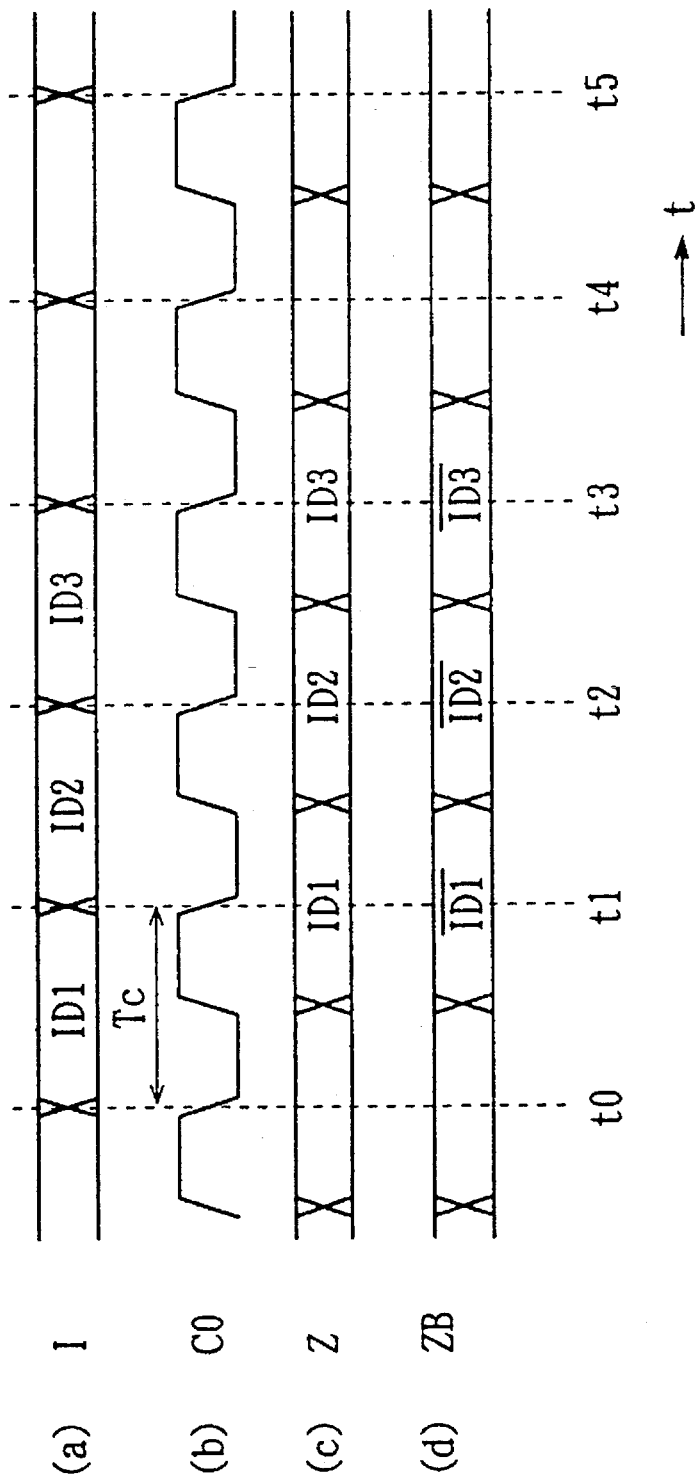
FIG. 23 is a timing chart showing the operation of the latch circuit of FIG. 22.

1:4 demultiplexer circuit 47 includes flipflop circuits 49, 53–56 having a structure shown in FIG. 16, latch circuits 50, 51, 57–60 having a structure as shown in FIG. 22, and a 3-input OR gate 52 having a structure shown in FIG. 4. Flipflop circuit 49, latch circuits 50, 51 and 3-input OR gate 52 form an internal clock generation circuit 48. Flipflop circuit 49 frequency-divides clock signal C0 applied to clock signal input terminal C' by a factor of 2 and provides that signal to latch circuit 50. Latch circuit 51 has a structure where data fetching and data holding operations are inverted by 180° with respect to latch circuit 50. Inverted output Q of latch circuit 51 is connected to data input D of latch circuit 50. By taking the output of latch circuit 50 and the output of latch circuit 51, four phases of overlap signals (signals having the high level and the low level overlapping each other) are obtained having the phase shifted by 90° from each other at a cycle four times that of clock signal C0 applied to clock signal input terminal C'.

3-input OR gate 52 receives a signal C (90°) and a signal C (180°) having a phase of 90° and a phase of 180°, respectively, displaced with respect to output C (0°) of latch circuit 50, as well as clock signal C0 applied to data signal input terminal C'. Thus, a latch signal LC is output that has a cycle 4Tc identical to those of the four phases of overlap signals C(0°)–C(270°) and that attains a low level once within this cycle when clock signal C0 is low. More specifically, internal clock generation circuit 48 outputs 4 first internal clock signals which are four phases of overlap signals from input clock signal C0, and also a second internal clock signal having a cycle four times that of clock signal C0 with respect to a serial data signal of 4 bits.

The four phases of overlap signals C(0°)–C(270°) are the clock signals of flipflop circuits 53–56 connected in parallel to data signal input terminal D'. Serial input data signal I is entered by flipflop circuits 53–56 according to 4 phases of overlap signals C(0°)–C(270°) displaced by 90° from each other, whereby the data is updated at 360°, i.e. for every 4 bits.

Output Q of flipflop circuits 53–56 is connected to input D of latch circuits 57–60, respectively. In response to latch signal LC, latch circuits 57–60 receive data from flipflop circuits 53–56, whereby data Z0–Z3 are provided to data signal output terminals QI'–Q3' and Q0'. Thus, serial data I of 4 bits is converted into parallel data Z0–Z3 of four bits in 1:4 demultiplexer circuit 47.

In the present embodiment, internal clock generation circuit 48 outputs 4 phases of internal clock signals C(0°)–C(270°) to drive flipflop circuits 53–56. AND gate 52 outputs a latch circuit LC to drive latch circuits 57–60. Therefore, the number of hardware components is reduced in comparison with the conventional case where internal clock generation circuit 111 outputs only four phases of internal clock signals C(0°)–C(270°) to drive flipflop circuits 115–126. Therefore, power consumption and layout area are reduced.

The present invention is not limited to the above-described embodiment where 1:4 demultiplexer circuit 47 was described, and is applicable to similar demultiplexer circuits such as a 1:8 demultiplexer circuit by using 8 phases of overlap signals displaced in phase by 45° C from each other and an internal signal that attains a high level or a low level once for every serial data of 8 bits.

Embodiment 5

Figure 11:
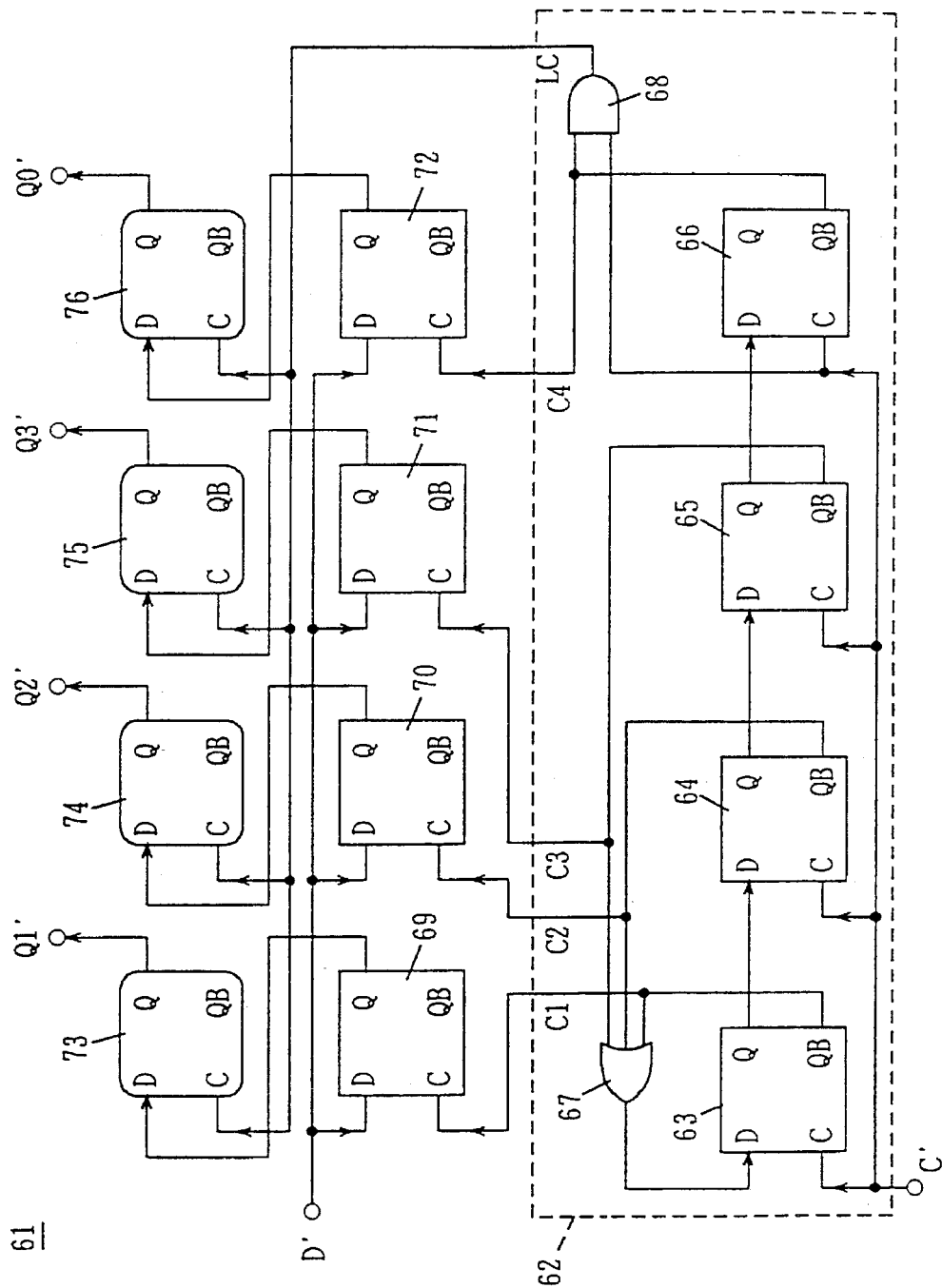
FIG. 11 is a block diagram showing a structure of a 1:4 demultiplexer circuit according to Embodiment 5 of the present invention.

In Embodiment 4, a 1:4 demultiplexer circuit 47 is formed using 4 phases of overlap signals C(0°)–C(270°) and a latch circuit LC having a cycle 4 times that of clock signal C0. A 1:4 demultiplexer circuit 47 can be formed using 4 phases of nonoverlapping signals C1–C4, and a latch signal LC having a cycle 4 times that of clock signal C0. FIG. 11 is a block diagram showing a structure of such a 1:4 demultiplexer circuit.

Figure 12:
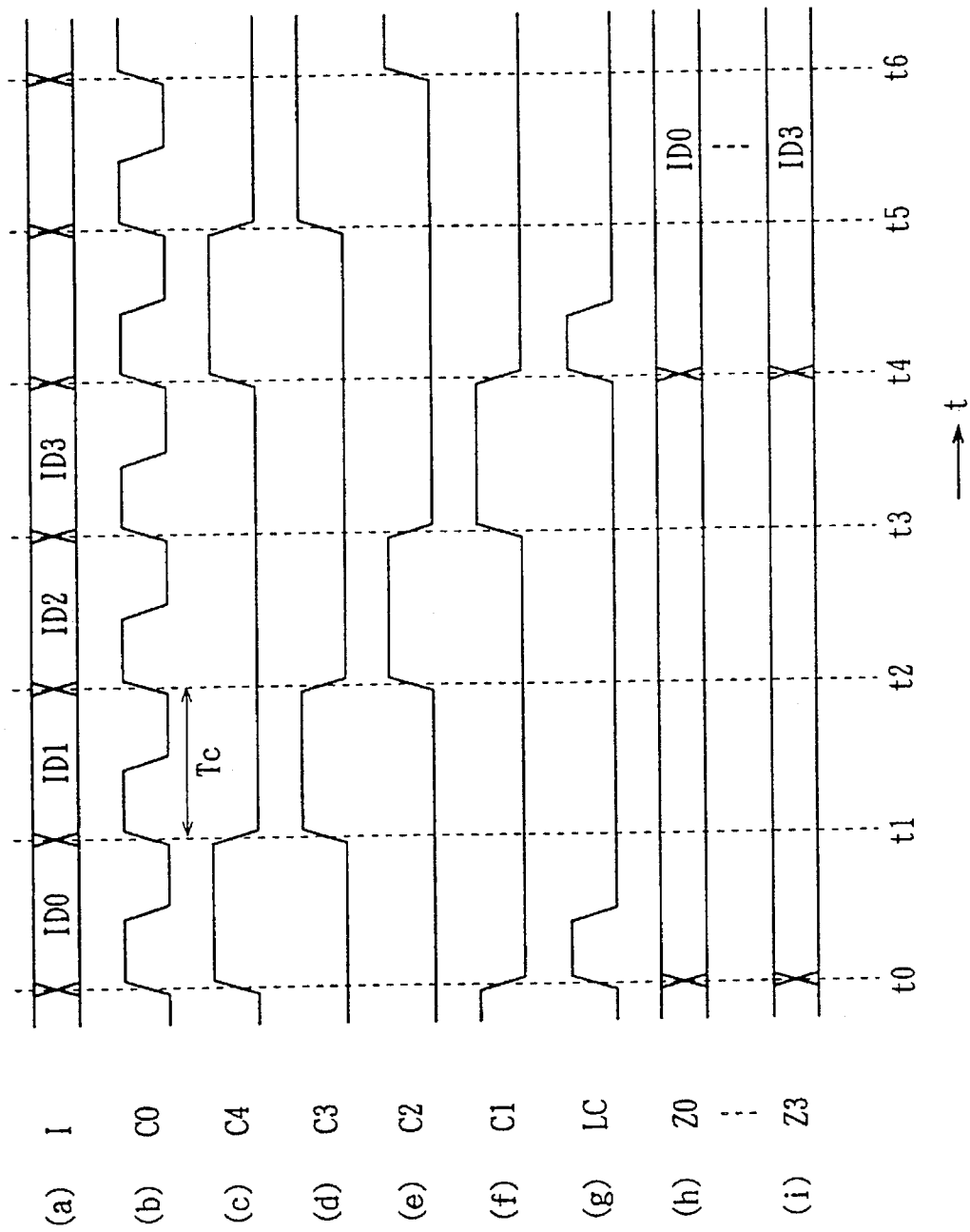
FIG. 12 is a timing chart showing the operation of the 1:4 demultiplexer circuit of FIG. 11.

Referring to FIG. 11, a 1:4 demultiplexer circuit 61 includes a clock signal input terminal C', a data signal input terminal D', and data signal output terminals Q0'–Q1'. Clock signal input terminal C' receives a clock signal C0, and data signal input terminal D' receives data signal I. Clock signal C0 attains a high level or a low level for every half cycle Tc/2 as shown in FIG. 12(b). Data signal I attains a high level or a low level at a cycle Tc identical to that of clock signal C0 in synchronization with a rise of clock signal C0 as shown in FIG. 12(a).

Figure 13:
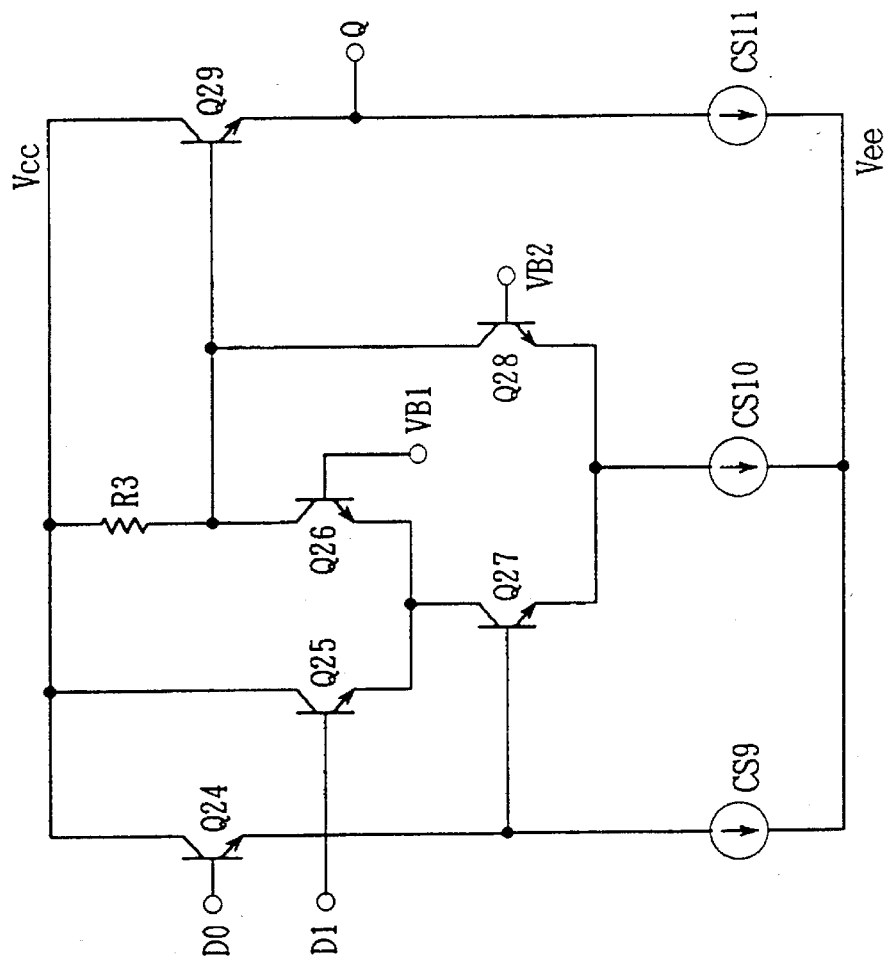
FIG. 13 is a circuit diagram showing the structure of a 2-input AND gate of the 1:4 demultiplexer circuit shown in FIG. 11.
Figure 14:
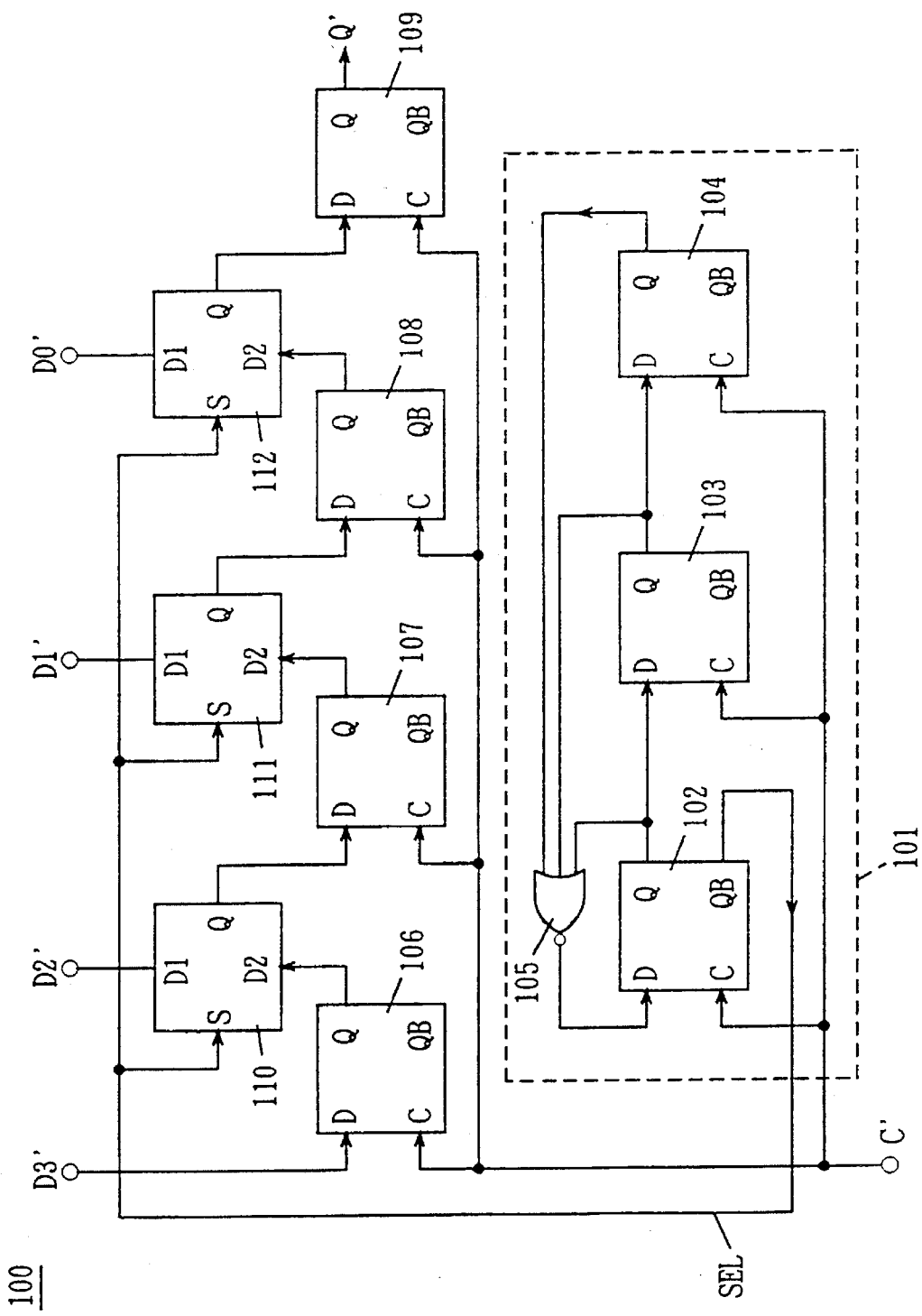
FIG. 14 is a block diagram showing a structure of a conventional 4:1 multiplexer circuit.
Figure 15:
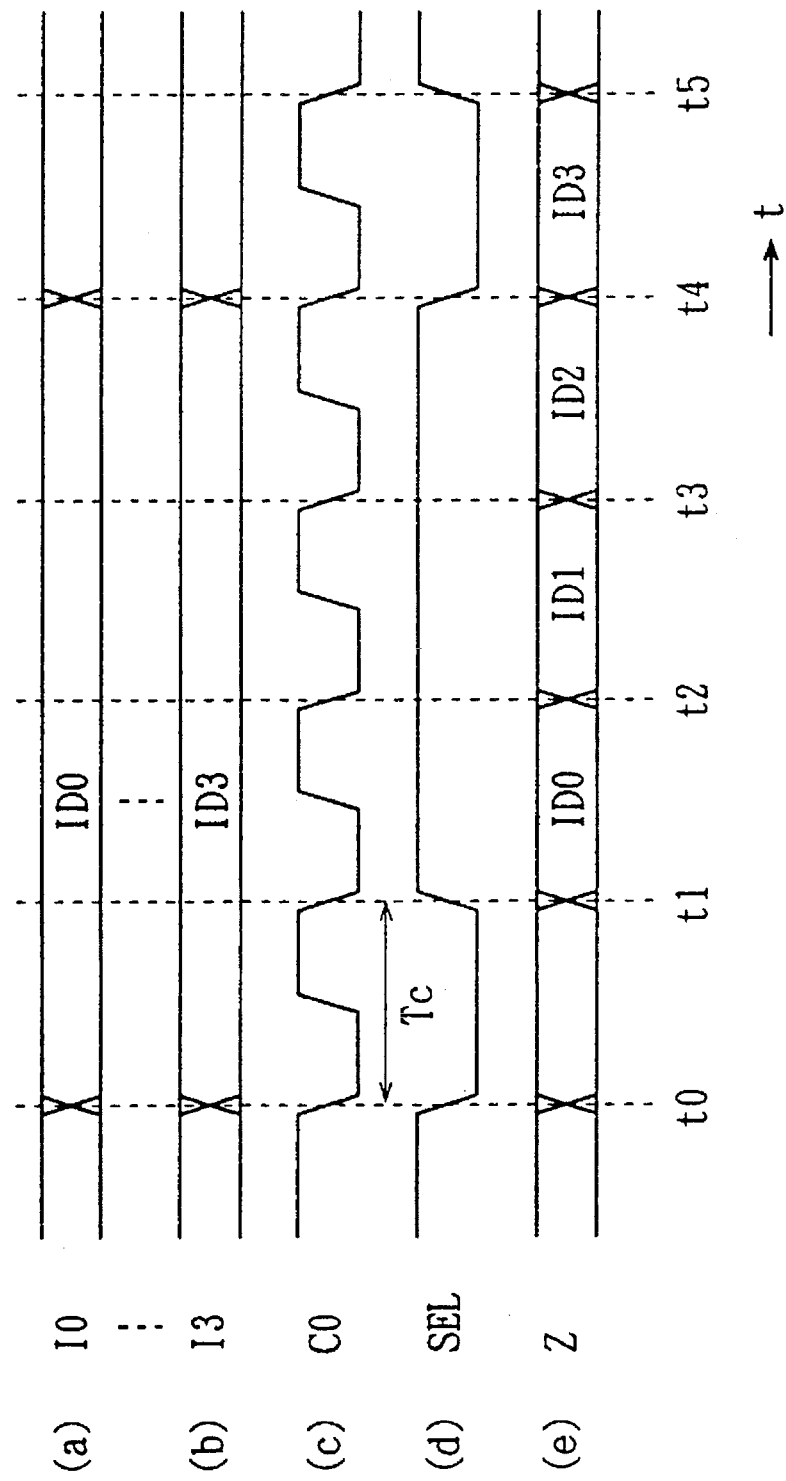
FIG. 15 is a timing chart showing the operation of the 4:1 multiplexer circuit of FIG. 14.

1:4 demultiplexer circuit 61 includes flipflop circuits 63–66, 69–72 having a structure shown in FIG. 16, a 3-input OR gate 67 having a structure shown in FIG. 4, a 2-input AND gate 68 having a structure shown in FIG. 13, and latch circuits 73–76 having a structure shown in FIG. 22. Flipflop circuits 63–66, 3-input OR gate 67, and 2-input AND gate 68 form an internal clock generation circuit 62. Internal clock generation circuit 62 has data shifted for every cycle of clock signal C0 applied to clock signal input terminal C' because output Q of each of flipflop circuits 63–65 is sequentially input to input D of a succeeding stage flipflop circuit. 3-input OR gate 67 receives inverted outputs QB of three flipflop circuits 63–65, so that a signal of a low level is output for only one cycle for every four cycles of clock signal C0. Therefore, by taking each inverted output QB of flipflop circuits 63–66, four phases of internal clock signals C1–C4 with no overlapping in the high level are obtained as shown in (c)–(f) in FIG. 12.

2-input AND gate 68 receives inverted output QB of flipflop circuit 66 and clock signal C0 applied to clock signal input terminal C' to generate a latch signal LC having a cycle four times that of clock signal C0 as shown in FIG. 12(g). More specifically, internal clock generation circuit 62 outputs 4 first internal clock signals which are 4 phases of nonoverlap signals from input clock signal C0, and also outputs a second internal clock signal having a frequency four times that of clock signal C0 with respect to serial data signal of 4 bits.

The four phases of internal clock signals C1–C0 are the clock signals of the four flipflop circuits 69–72 connected in parallel to data signal input terminal D'. Serially input data signal I is fetched by flipflop circuits 69–72 according to 4 phases of internal clock signal C1–C4.

Output Q of each of flipflop circuits 69–72 is connected to input D of latch circuits 63–76, respectively. In response to latch signal LC, latch circuits 73–76 fetch data from flipflop circuits 69–72, whereby data Z0–Z3 are provided from data signal output terminals Q1'–Q3', and Q0', respectively. Thus, 1:4 demultiplexer circuit 61 converts a 4-bit serial data I into 4 bits of parallel data Z0–Z3.

In the present embodiment, internal clock generation circuit 64 outputs four phases of internal clock signals C1–C4 to drive flipflop circuits 69–72, and AND gate 68 outputs a latch signal LC to drive latch circuits 73–76. Therefore, the number of the hardware components can be reduced in comparison with the conventional case where internal clock generation circuit 111 outputs only four phases of internal clock signals C(0°)–C(270°) to drive flipflop circuits 115–126. Therefore, the power consumption and the layout area are reduced.

The present invention is not limited to the above-described embodiment where a 1:4 demultiplexer circuit is described, and is applicable to a similar demultiplexer circuit such as a 1:8 demultiplexer circuit by using 8 phases of non-overlap signals and an internal signal that attains a high level or a low level once for every serial data of 8 bits.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A multiplexer circuit for converting M parallel data signals (M is an integer of at least 2) of a bit into a serial data signal of M bits in synchronization with a clock signal, said multiplexer circuit comprising:

a select signal generation circuit receiving said clock signal for generating M phases of select signals differing in phase from each other and having a cycle M times that of said received clock signal, said M phases of select signals sequentially attaining an activation potential for each time period corresponding to one cycle of said clock signal; and a selector circuit receiving said M parallel data signals of a bit and said M phases of select signals for selecting M parallel data signals of a bit one at a time according to said received M phases of select signals to output a serial data signal of M bits, said selector circuit including an output terminal outputting said serial data signal of M bits, a power supply circuit, M signal generation circuits provided corresponding to said M parallel data signals of a bit, respectively, each signal generation circuit being driving by a power supply current from said power supply circuit to provide, to the output terminal, a data signal according to a corresponding parallel data signal, and M connection circuits provided corresponding to the M signal generation circuits, respectively, for receiving M select signals, respectively, each connection circuit connecting the power supply circuit and a corresponding signal generation circuit in response to a received select signal attaning the activation potential.

2. The multiplexer circuit according to claim 1, wherein said select signal generation circuit comprises first to Mth flipflop circuits connected in series, each receiving said clock signal at a clock node for providing said select signal from an inversion output node thereof, and an OR circuit for receiving inverted outputs of said first to (M-1)th flipflop circuits to provide an OR signal thereof to an input node of the first flipflop circuit.

3. The multiplexer circuit according to claim 1, further comprising:

a holding circuit receiving a serial data signal from said selector circuit for temporarily holding said serial data signal and then outputting said serial data signal in synchronization with said clock signal.

4. A multiplexer circuit for converting M parallel data signals of a bit into a serial data signal of M bits in synchronization with a clock signal, said multiplexer circuit comprising:

a select signal generation circuit receiving said clock signal for generating M phases of select signals differing in phase from each other and having a cycle M times that of the received clock signal, N selector circuits, each receiving M/N parallel data signals of a bit out of said M parallel data signals of a bit and M/N phases of select signals out of said M phases of select signals for selecting M/N parallel data signals of a bit one at a time according to the input M/N phases of select signals to output a serial data signal of M/N bits, a switch signal generation circuit receiving said clock signal for generating a switch signal to sequentially switch an output of said N selector circuits, and a switch circuit receiving outputs of said N selector circuits and said switch signal for sequentially switching each output of said N selector circuits to output a serial data signal of M bits.

5. The multiplexer circuit according to claim 4, wherein said select signal generation circuit comprises first to Mth flipflop circuits connected in series, each receiving said clock signal at a clock node for outputting said select signal from an inversion output node thereof, and an OR circuit receiving inverted outputs of said first to (M-1)th flipflop circuits for providing an OR signal thereof to an input node of the first flipflop circuit.

6. The multiplexer circuit according to claim 4, further comprising:

a holding circuit receiving a serial data signal from said selector circuit for temporarily holding said serial data signal and then outputting said serial data signal in synchronization with said clock signal.

7. A multiplexer circuit for converting M parallel data signals of a bit into a serial data signal of M bits in synchronization with a clock signal, said multiplexer circuit comprising:

a select signal generation circuit for generating M/N phases of select signals differing in phase from each other and having a cycle M times that of said clock signal, N selector circuits receiving M/N parallel data signals of a bit out of said M parallel data signals of a bit and said M/N phases of select signals for selecting M/N parallel data signals of a bit one at a time according to the input M/N phases of select signals to output a serial data signal of M/N bits, a switch signal generation circuit receiving said clock signal for generating a switch signal to sequentially switch an output of said N selector circuits, and a switch circuit receiving outputs of said N selector circuits and said switch signal for sequentially switching each output of said N selector circuits to output a serial data signal of M bits.

8. The multiplexer circuit according to claim 7, wherein said select signal generation circuit comprises first to M/Nth flipflop circuits connected in series, each receiving said clock signal at a clock node thereof for providing said select signal from an inversion output node thereof, an OR circuit receiving inverted outputs of said first to (M/N-1)th flipflop circuits for providing an OR signal thereof to an input node of the first flipflop circuit.

9. The multiplexer circuit according to claim 7, further comprising:

a holding circuit receiving a serial data signal from said switch circuit for temporarily holding said serial data signal and then outputting said serial data signal in synchronization with said clock signal.

10. A demultiplexer circuit for converting a serial data signal of M bits received at an input terminal into M parallel data signals of a bit to provide said M parallel data signals of a bit to M output terminals in synchronization with a clock signal, said demultiplexer circuit comprising:

an internal clock generation circuit receiving said clock signal for outputting M phases of first internal clock signals differing in phase from each other and having a cycle M times that of the received clock signal, and outputting a second internal clock signal having a cycle M times that of said received clock signal, and M data conversion units provided corresponding to said M output terminals, each receiving a serial data signal of M bits applied to said input terminal, and also receiving one of M first internal clock signals from said internal clock generation circuit and a second internal clock signal, for fetching 1 bit of data signal out of a serial data signal of M bits received according to the received first internal clock signal, and providing said fetched 1 bit of data signal to a corresponding output terminal according to said second internal clock signal as one of M parallel data signals of a bit, wherein said internal clock generation circuit comprises a flipflop circuit receiving said clock signal at a clock node thereof and an inverted output thereof at an input node, first to M/2th (M/2 is an integer) latch circuits connected in series, each receiving an output of said flipflop circuit at a clock node thereof for outputting said first internal clock signal from an output node and an inversion output node thereof, and an OR circuit receiving predetermined M-2 phases of first internal clock signals out of said M phases of first internal clock signals and said clock signal for providing an OR signal thereof as said second internal clock signal, wherein said first latch circuit receives an inverted output of said M/2 latch circuits at an input node thereof.

11. A demultiplexer circuit for converting a serial data signal of M bits applied to an input terminal into M parallel data signals of a bit to provide said M bits of parallel data signal to M output terminals in synchronization with a clock signal, said demultiplexer circuit comprising:

an internal clock generation circuit receiving said clock signal for outputting M phases of first internal clock signals differing in phase having a cycle M times that of the received clock signal and corresponding to said M output terminals, and outputting a second internal clock signal having a cycle M times that of said received clock signal, M flipflop circuits provided corresponding to said M output terminals, each having an input node connected to said input terminal for receiving a first internal clock signal from said internal clock generation circuit corresponding to the corresponding output terminal at a clock node, and M latch circuits provided corresponding to said M output terminals, each having an input node connected to an output node of a flipflop circuit corresponding to the corresponding output terminal, and an output node connected to the corresponding output terminal for receiving at a clock node a second internal clock signal from said internal clock generation circuit.

12. The demultiplexer circuit according to claim 11, wherein said internal clock generation circuit comprises a flipflop circuit receiving said clock signal at a clock node and an inverted output thereof at an input node, first to M/2th (M/2 is an integer) latch circuits connected in series, each receiving an output of said flipflop circuit at a clock node for providing said first internal clock signal from an output node and an inversion output node, and an OR circuit for receiving predetermined M-2 phases of first internal clock signals out of said M phases of first internal clock signals and said clock signal for providing an OR signal thereof as said second internal clock signal, wherein said first latch circuit receives an inverted output of said M/2 latch circuits at an input node thereof.

13. The demultiplexer circuit according to claim 11, wherein said internal clock generation circuit comprises first to Mth flipflop circuits connected in series, each receiving said clock signal at a clock node for providing said first clock signal from an inverted output node thereof, an OR circuit receiving inverted outputs of said first to (M-1)th flipflop circuits for providing an OR signal thereof to an input node of the first flipflop circuit, and an AND circuit receiving inverted outputs of said M flipflop circuits and said clock signal for providing an AND signal thereof as said second clock signal.

* * * * *